United States Patent
Yamabe

(10) Patent No.: US 12,108,598 B2
(45) Date of Patent: Oct. 1, 2024

(54) SEMICONDUCTOR STORAGE DEVICE WITH PILLAR

(71) Applicant: Kioxia Corporation, Tokyo (JP)

(72) Inventor: Kazuharu Yamabe, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 97 days.

(21) Appl. No.: 17/190,739

(22) Filed: Mar. 3, 2021

(65) Prior Publication Data

US 2022/0068949 A1    Mar. 3, 2022

(30) Foreign Application Priority Data

Aug. 31, 2020    (JP) ................................. 2020-146059

(51) Int. Cl.
    *H10B 43/20*    (2023.01)
    *H01L 23/00*    (2006.01)
    (Continued)

(52) U.S. Cl.
    CPC ............. *H10B 43/20* (2023.02); *H01L 24/06* (2013.01); *H01L 24/45* (2013.01); *H10B 41/10* (2023.02);
    (Continued)

(58) Field of Classification Search
    CPC ........ H10B 43/20; H10B 41/10; H10B 41/20; H10B 41/40; H10B 43/10; H10B 43/40;
    (Continued)

(56) References Cited

U.S. PATENT DOCUMENTS

| | | | |
|---|---|---|---|
| 10,510,415 B1 | 12/2019 | Huo et al. | |
| 10,629,616 B1 | 4/2020 | Kai et al. | |
| 2013/0270631 A1* | 10/2013 | Kim ....................... | H10B 43/35 257/331 |

(Continued)

FOREIGN PATENT DOCUMENTS

| | | |
|---|---|---|
| JP | 2018-026518 A | 2/2018 |
| JP | 2020-145233 A | 9/2020 |
| TW | I698001 B | 7/2020 |

OTHER PUBLICATIONS

Huo et al., "Unleash scaling potential of 3D NAND with innovative Xtacking® Architecture", 2022 IEEE Symposium on VLSI Technology and Circuits (VLSI Technology and Circuits); https://doi.org/10.1109/vlsitechnologyandcir46769.2022.9830285 (2 pages).

*Primary Examiner* — Duy T Nguyen
(74) *Attorney, Agent, or Firm* — Foley & Lardner LLP

(57) ABSTRACT

A semiconductor storage device includes a substrate, a plurality of first conductive layers arranged in a first direction intersecting with a surface of the substrate, a first semiconductor layer that extends in the first direction and faces the plurality of first conductive layers, a first gate insulating film that extends in the first direction and covers an outer peripheral surface of the first semiconductor layer, a first insulating layer that extends in the first direction and has an outer peripheral surface covered with the first semiconductor layer, and a second conductive layer that is farther from the substrate than the plurality of first conductive layers and is connected to one end in the first direction of the first semiconductor layer. The first semiconductor layer includes a first region facing the plurality of first conductive layers and a second region farther from the substrate than the first region. The second conductive layer is connected to an inner peripheral surface and an outer peripheral surface of the second region of the first semiconductor layer and is in contact with one end in the first direction of the first insulating layer.

10 Claims, 31 Drawing Sheets

(51) Int. Cl.
  *H10B 41/10* (2023.01)
  *H10B 41/20* (2023.01)
  *H10B 41/40* (2023.01)
  *H10B 43/10* (2023.01)
  *H10B 43/40* (2023.01)
(52) U.S. Cl.
  CPC ............. *H10B 41/20* (2023.02); *H10B 41/40* (2023.02); *H10B 43/10* (2023.02); *H10B 43/40* (2023.02)
(58) Field of Classification Search
  CPC ........ H10B 41/27; H10B 41/50; H10B 43/27; H10B 43/50; H10B 43/30; H10B 41/30; H01L 24/06; H01L 24/45; H01L 24/05; H01L 24/08; H01L 2224/05548; H01L 2224/08145; H01L 2224/09181; H01L 2224/80357; H01L 2224/80895; H01L 2224/80896; H01L 2224/94
  USPC ......................................................... 257/314
  See application file for complete search history.

(56) References Cited

U.S. PATENT DOCUMENTS

| | | | |
|---|---|---|---|
| 2015/0129878 A1* | 5/2015 | Shin ................... | H01L 29/7926 257/329 |
| 2015/0279852 A1* | 10/2015 | Mizutani ................. | G11C 8/14 257/315 |
| 2016/0141419 A1* | 5/2016 | Baenninger ........... | H10B 41/35 257/314 |
| 2016/0233224 A1* | 8/2016 | Rhie ...................... | H10B 43/10 |
| 2017/0077114 A1* | 3/2017 | Yoshimori ............ | H01L 23/528 |
| 2017/0092651 A1* | 3/2017 | Kim .................... | H01L 23/5283 |
| 2019/0287628 A1* | 9/2019 | Naito ..................... | H10B 43/27 |
| 2019/0312050 A1* | 10/2019 | Lai ........................ | H10B 43/27 |
| 2020/0091165 A1* | 3/2020 | Yamashita ........ | H01L 27/11582 |
| 2020/0258816 A1 | 8/2020 | Okina et al. | |
| 2020/0258904 A1 | 8/2020 | Kai et al. | |
| 2020/0286876 A1* | 9/2020 | Nakaki ................. | H01L 25/0657 |
| 2021/0013303 A1 | 1/2021 | Chen et al. | |
| 2022/0302150 A1 | 9/2022 | Zhang et al. | |
| 2022/0302151 A1 | 9/2022 | Zhang et al. | |
| 2022/0359560 A1 | 11/2022 | Bae | |
| 2022/0359564 A1 | 11/2022 | Oh et al. | |

* cited by examiner

SEMICONDUCTOR STORAGE DEVICE WITH PILLAR

CROSS-REFERENCE TO RELATED APPLICATION(S)

This application is based upon and claims the benefit of priority from Japanese Patent Application No. 2020-146059, filed on Aug. 31, 2020, the entire contents of which are incorporated herein by reference.

FIELD

Embodiments described herein relate generally to a semiconductor storage device.

BACKGROUND

A semiconductor storage device may include a substrate, a plurality of conductive layers stacked in a direction intersecting with the surface of the substrate, a semiconductor layer facing these plurality of conductive layers, and a gate insulating layer formed between the conductive layers and the semiconductor layer. The gate insulating layer includes a memory unit capable of storing data such as, for example, an insulating charge storage layer such as silicon nitride ($Si_3N_4$) or a conductive charge storage layer such as a floating gate.

DETAILED DESCRIPTION

Figure 1:
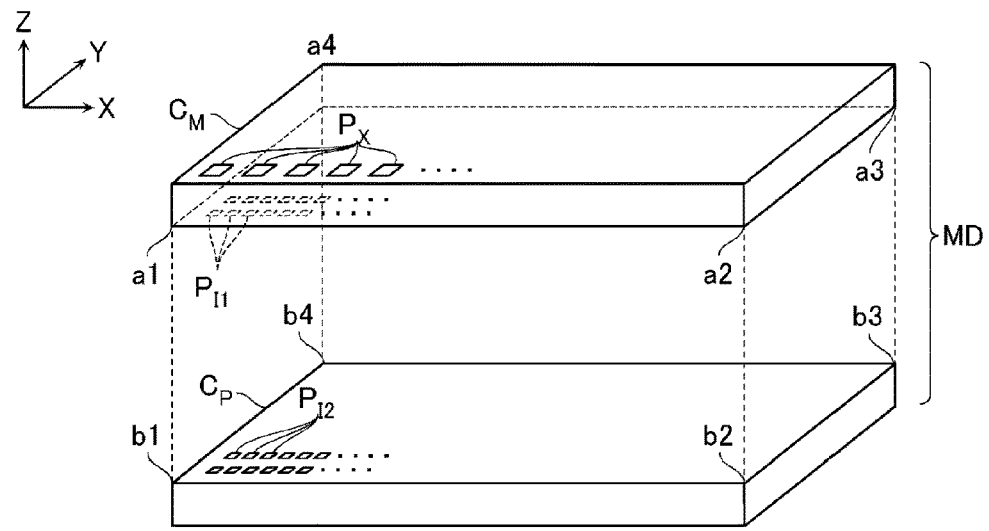
FIG. 1 is a schematic perspective view illustrating a configuration of a memory die MD according to a first embodiment.

At least one embodiment provides a semiconductor storage device which may be suitably manufactured.

In general, according to at least one embodiment, a semiconductor storage device includes a substrate, a plurality of first conductive layers arranged in a first direction intersecting with a surface of the substrate, a first semiconductor layer that extends in the first direction and faces the plurality of first conductive layers, a first gate insulating film that extends in the first direction and covers an outer peripheral surface of the first semiconductor layer, a first insulating layer that extends in the first direction and has an outer peripheral surface covered with the first semiconductor layer, and a second conductive layer that is farther from the substrate than the plurality of first conductive layers and is connected to one end in the first direction of the first semiconductor layer. The first semiconductor layer includes a first region facing the plurality of first conductive layers and a second region farther from the substrate than the first region. The second conductive layer is connected to an inner peripheral surface and an outer peripheral surface of the second region of the first semiconductor layer and is in contact with one end in the first direction of the first insulating layer.

Next, a semiconductor storage device according to at least one embodiment is described in detail with reference to the drawings. Furthermore, the following embodiments are merely examples, and are not intended to limit the present disclosure. Further, the following drawings are schematic, and for convenience of explanation, some configurations may be omitted. Further, the same reference numerals may be given to parts common to a plurality of embodiments, and descriptions thereof may be omitted.

Further, when referring to "semiconductor storage device" in this specification, it may mean a memory die, or may mean a memory system including a controller die such as a memory chip, a memory card, or a solid state drive (SSD). Moreover, the semiconductor storage device may mean a configuration including a host computer such as a smart phone, a tablet terminal, or a personal computer.

Further, in this specification, when a first configuration is referred to as being "electrically connected" to a second configuration, the first configuration may be directly connected to the second configuration, or the first configuration may be connected to the second configuration via a wiring, a semiconductor member, or a transistor. For example, when three transistors are connected in series, a first transistor is "electrically connected" to a third transistor even if a second transistor is in the OFF state.

Further, in the present specification, a predetermined direction parallel to the surface of a substrate is referred to as the X direction, a direction parallel to the surface of the substrate and perpendicular to the X direction is referred to as the Y direction, and a direction perpendicular to the surface of the substrate is referred to as the Z direction.

Further, in this specification, a direction along a predetermined surface is referred to as a first direction, a direction intersecting with the first direction along the predetermined surface is referred to as a second direction, and a direction intersecting with the predetermined surface is referred to as a third direction. The first direction, the second direction, and the third direction may or may not correspond to any of the X direction, the Y direction, and the Z direction.

Further, in this specification, expressions such as "upper (above)" and "lower (below)" are on the basis of the substrate. For example, a direction farther away from the substrate along the Z direction is referred to as "upper", and a direction closer to the substrate along the Z direction is referred to as "lower". Further, when referring to a lower surface or lower end with respect to a certain configuration, it means a surface or end of this configuration on the substrate side, and when referring to an upper surface or upper end thereof, it means a surface or end of this configuration opposite to the substrate. Further, a surface intersecting with the X direction or the Y direction is referred to as a side surface.

Further, in this specification, when referring to the "width," "length," or "thickness" in a predetermined direction with respect to a configuration or a member, it may mean the width, the length, or the thickness in the cross section observed by a scanning electron microscopy (SEM) or transmission electron microscopy (TEM).

First Embodiment

[Structure of Memory Die MD]

FIG. 1 is a schematic exploded perspective view illustrating a configuration example of a semiconductor storage device according to at least one embodiment. The semiconductor storage device according to at least one embodiment includes a memory die MD. The memory die MD includes a chip $C_M$ including a memory cell array and a chip $C_P$ including a peripheral circuit.

A plurality of bonding pad electrodes $P_X$ are provided on the upper surface of the chip $C_M$. Further, a plurality of first laminated electrodes $P_{I1}$ are provided on the lower surface of the chip $C_M$. Further, a plurality of second laminated electrodes $P_{I2}$ are provided on the surface of the chip $C_P$. Hereinafter, with respect to the chip $C_M$, the surface on which the plurality of first laminated electrodes $P_{I1}$ are provided is referred to as a surface, and the surface on which the plurality of bonding pad electrodes $P_X$ are provided is referred to as a back surface. Further, with respect to the chip $C_P$, the surface on which the plurality of second laminated electrodes $P_{I2}$ are provided is referred to as a surface, and the surface opposite to that surface is referred to as a back surface. In the illustrated example, the surface of the chip $C_P$ is provided above the back surface of the chip $C_P$, and the back surface of the chip $C_M$ is provided above the surface of the chip $C_M$.

The chip $C_M$ and the chip $C_P$ are arranged such that the surface of the chip $C_M$ and the surface of the chip $C_P$ face each other. The plurality of first laminated electrodes $P_{I1}$ are provided corresponding to the plurality of second laminated electrodes $P_{I2}$, respectively, and are arranged at positions where they may be laminated to the plurality of second laminated electrodes $P_{I2}$. The first laminated electrodes $P_{I1}$ and the second laminated electrodes $P_{I2}$ function as laminated electrodes that laminates the chip $C_M$ and the chip $C_P$ and electrically connects the chip $C_M$ and the chip $C_P$. The bonding pad electrodes $P_X$ function as electrodes for electrically connecting the memory die MD to a controller die (not illustrated).

Furthermore, in the example of FIG. 1, the corner portions a1, a2, a3, and a4 of the chip $C_M$ correspond to the corner portions b1, b2, b3, and b4 of the chip $C_P$, respectively.

Figure 2:
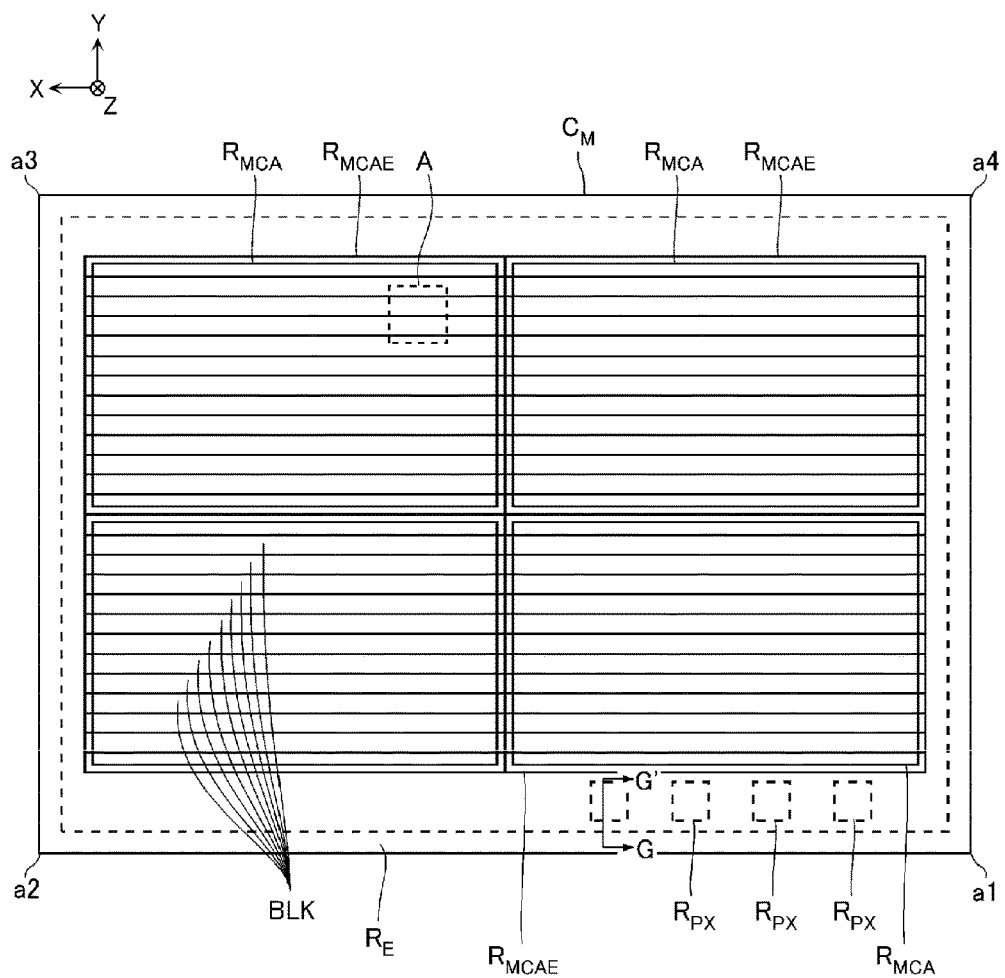
FIG. 2 is a schematic bottom view illustrating a configuration of a chip $C_M$.
Figure 3:
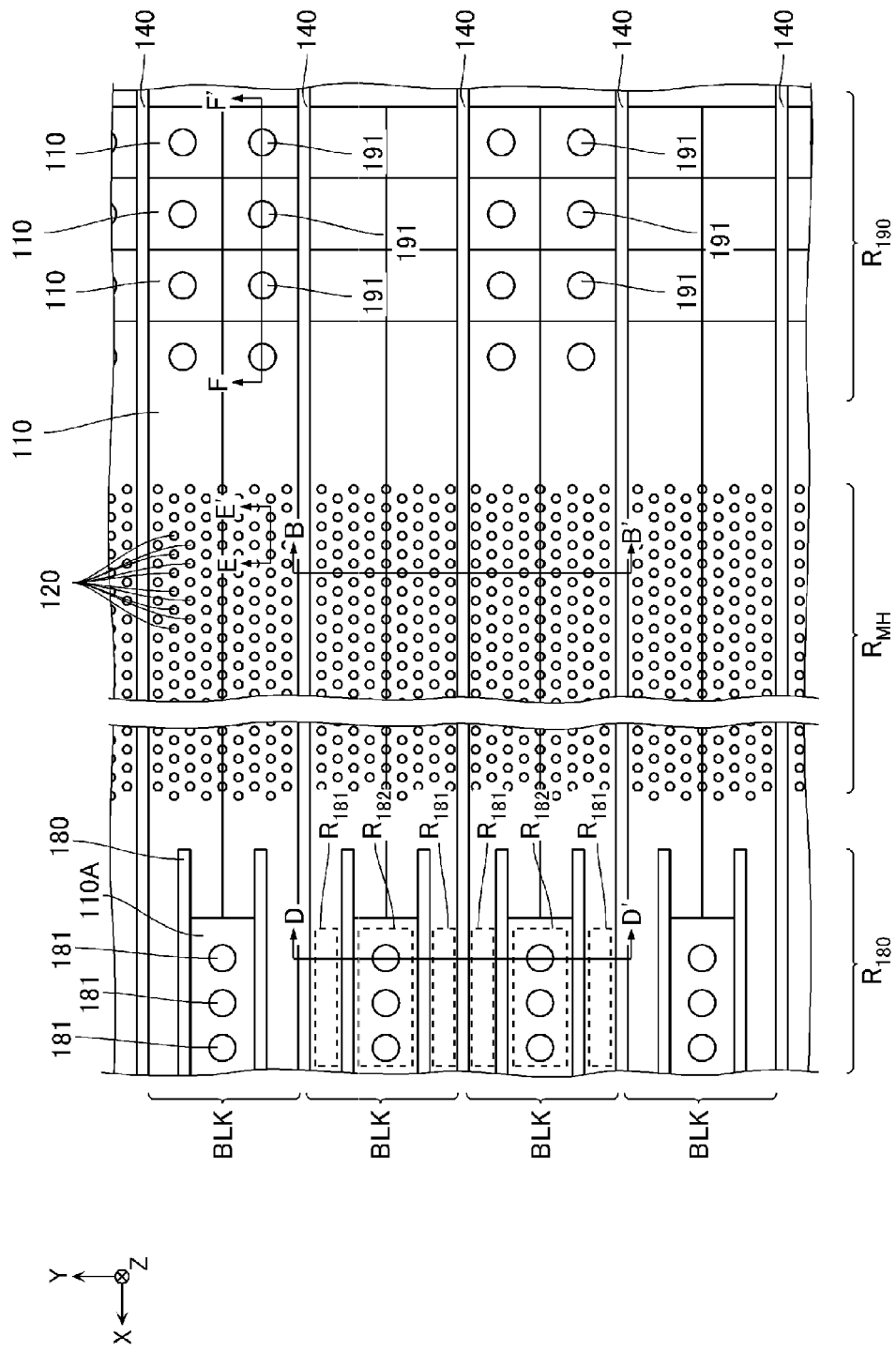
FIG. 3 is a schematic bottom view illustrating a partial configuration of the chip $C_M$.
Figure 4:
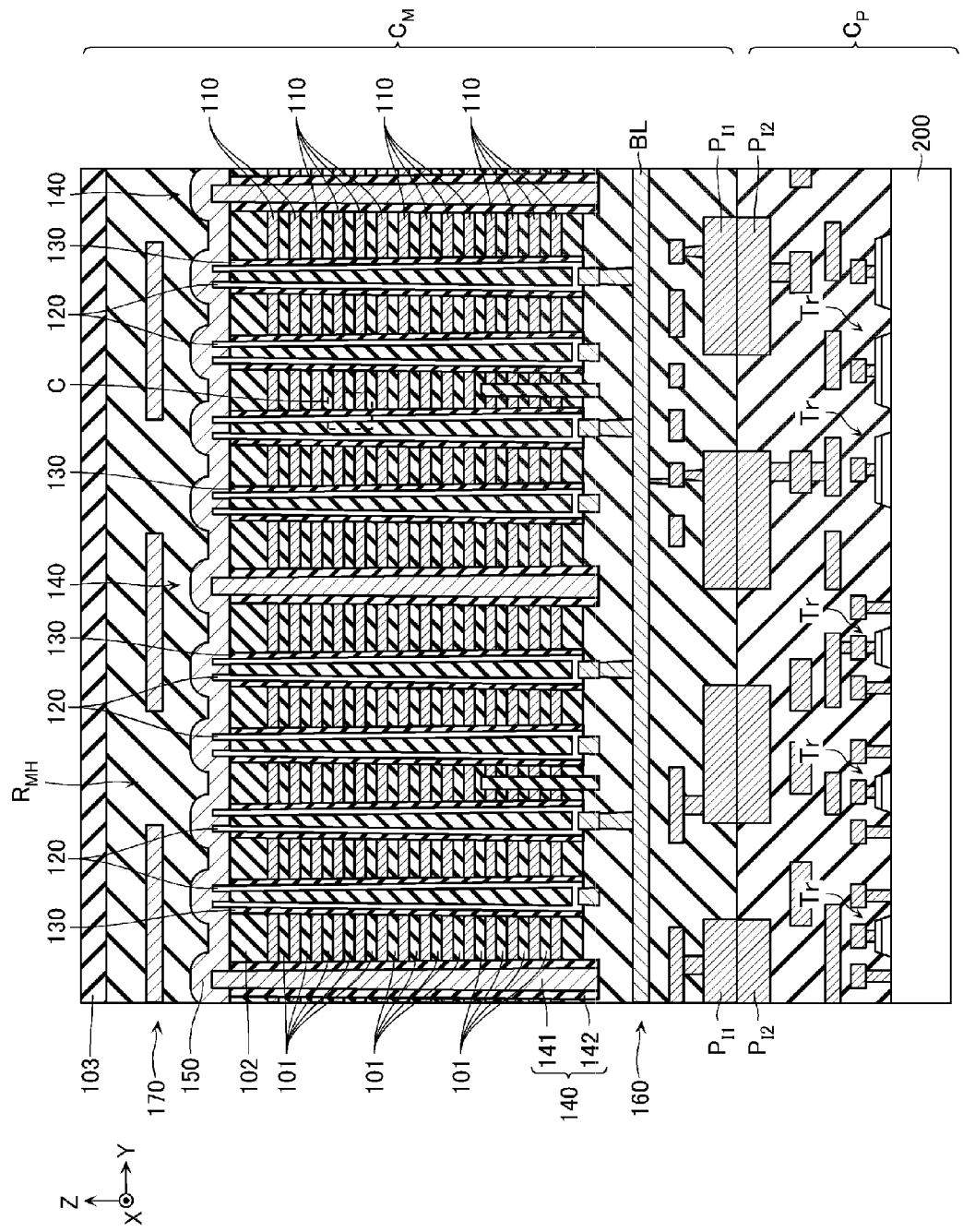
FIG. 4 is a schematic cross-sectional view illustrating a partial configuration of the chip $C_M$.
Figure 5:
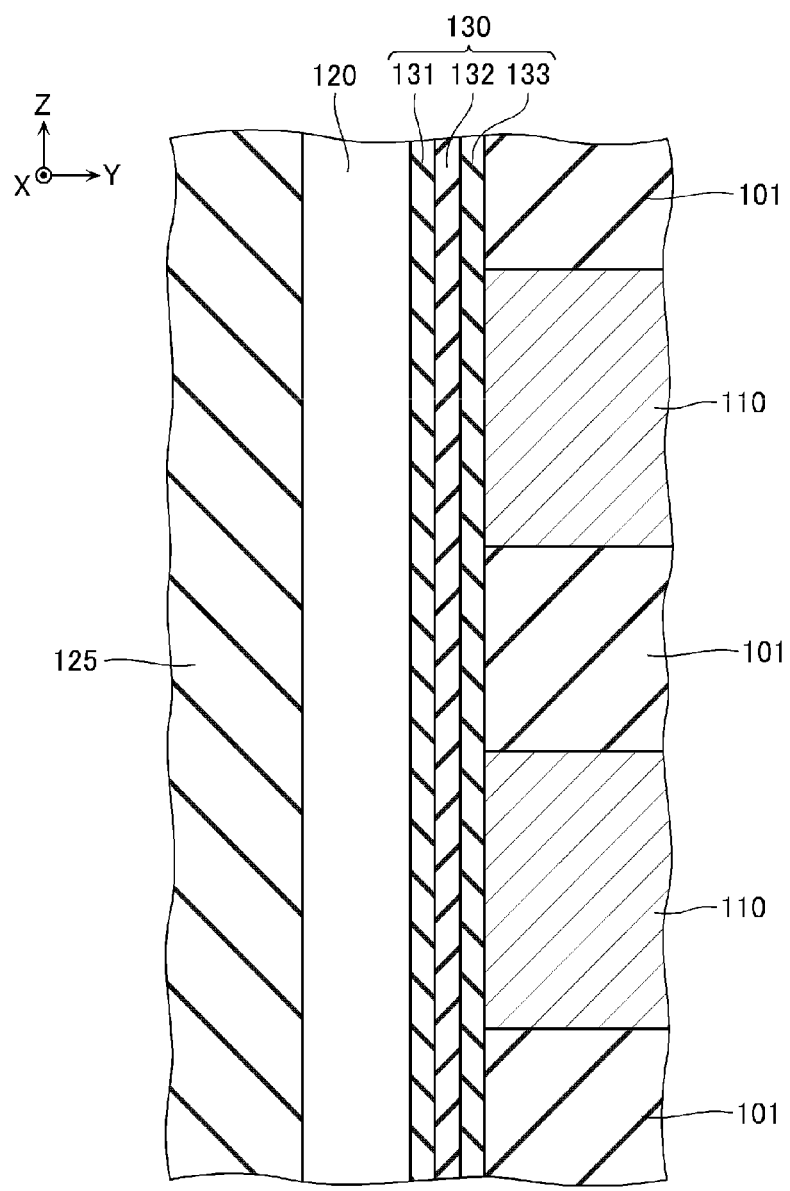
FIG. 5 is a schematic cross-sectional view illustrating a partial configuration of the chip $C_M$.
Figure 6:
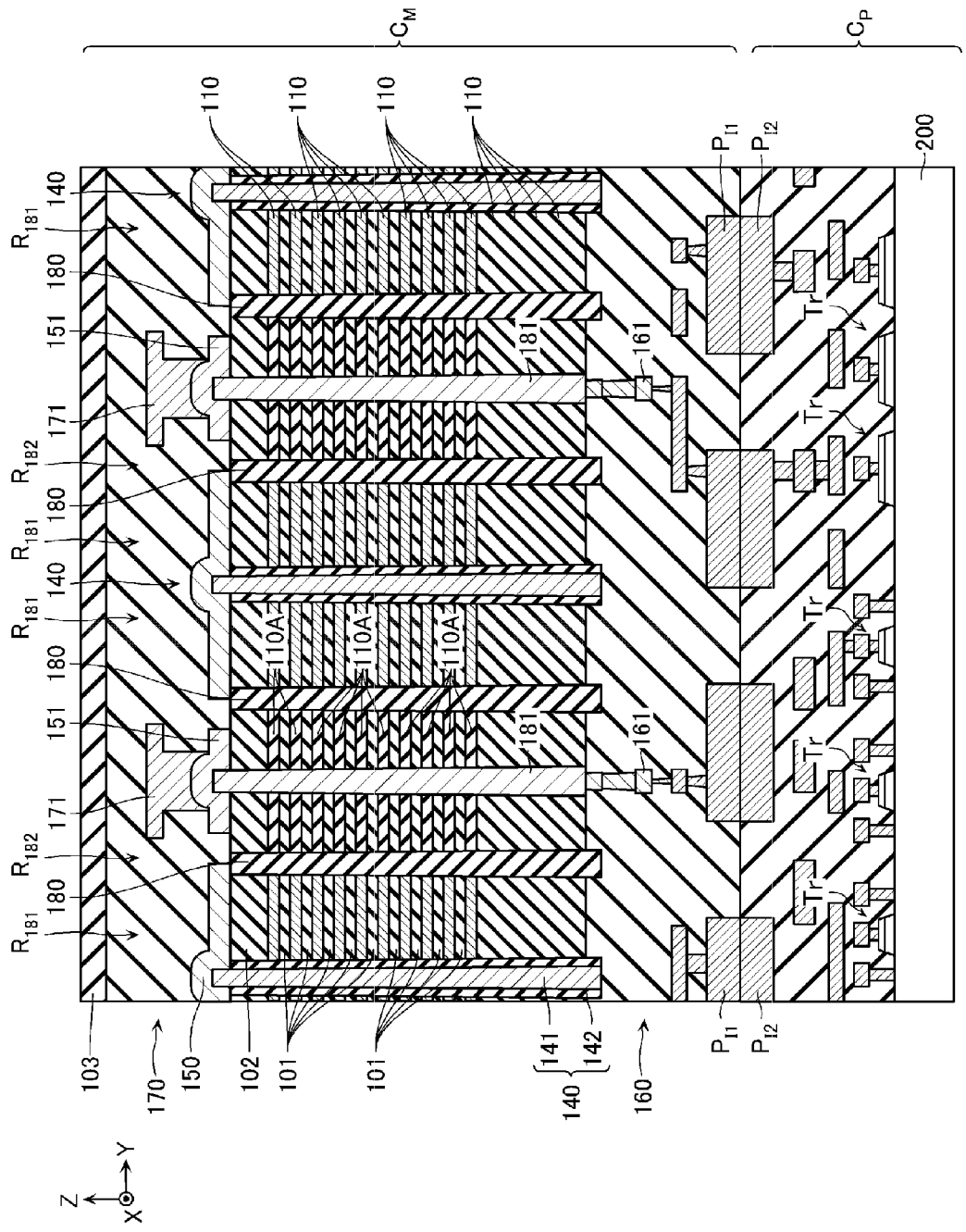
FIG. 6 is a schematic cross-sectional view illustrating a partial configuration of the chip $C_M$.
Figure 7:
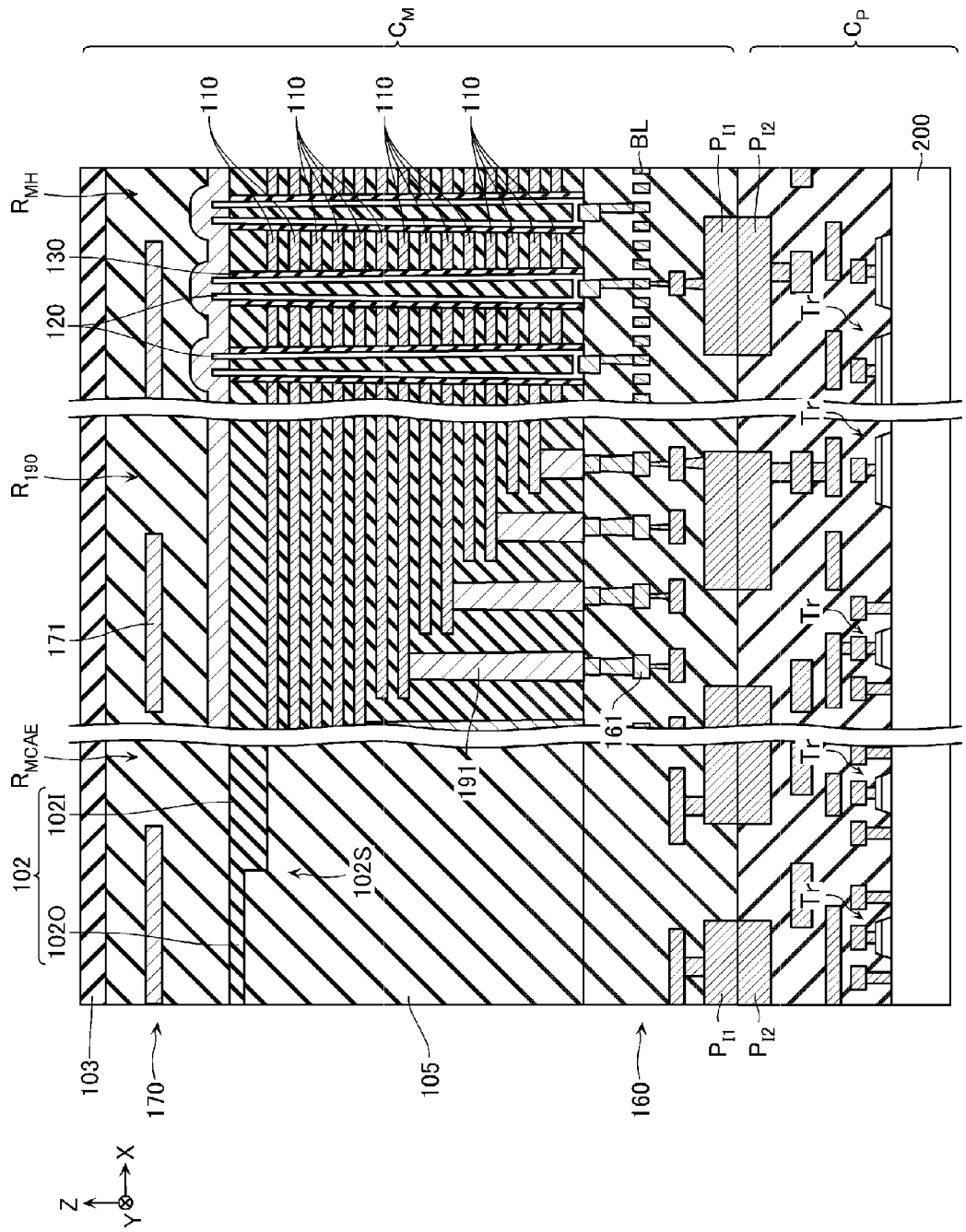
FIG. 7 is a schematic cross-sectional view illustrating a partial configuration of the chip $C_M$.
Figure 8:
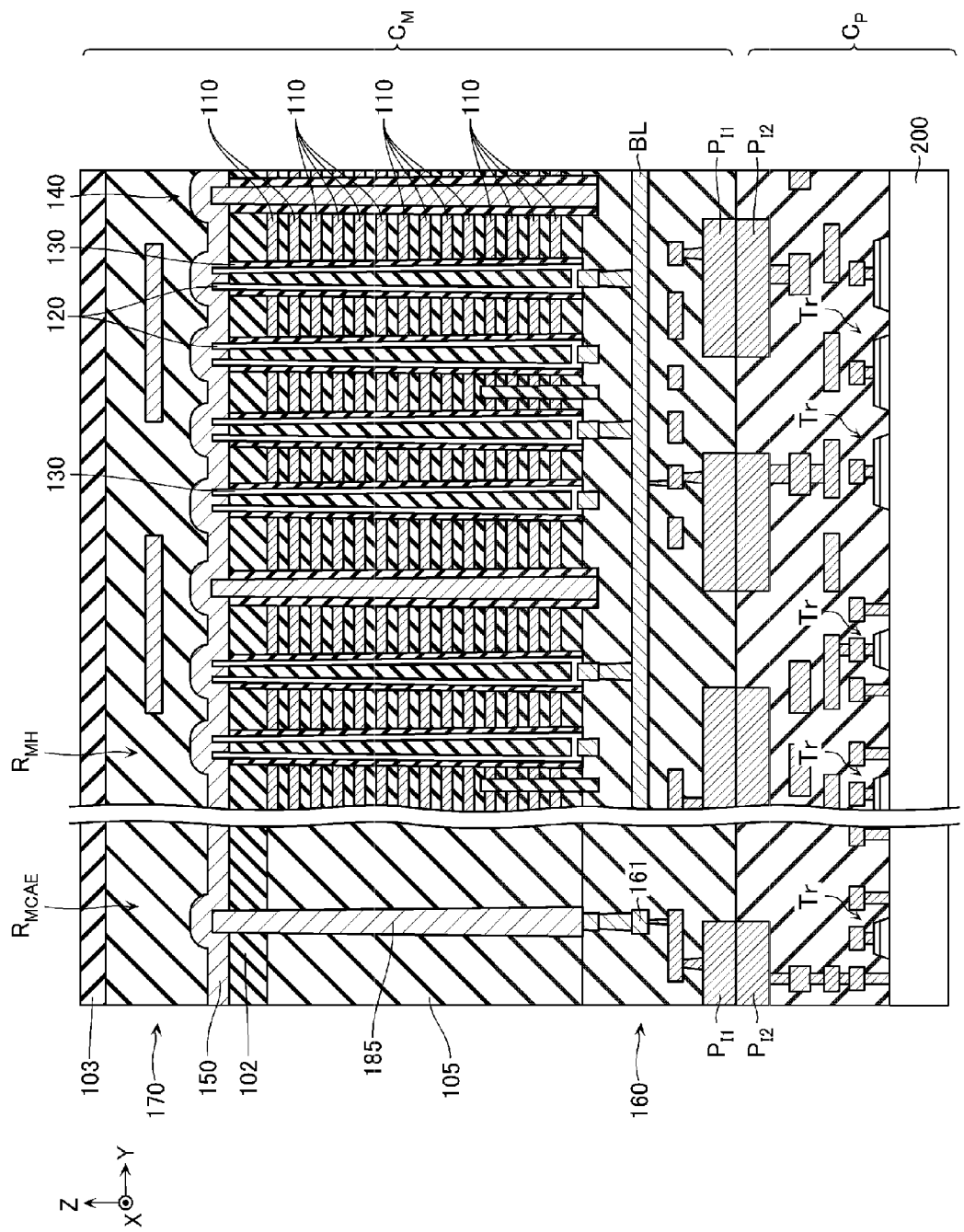
FIG. 8 is a schematic cross-sectional view illustrating a partial configuration of the chip $C_M$.
Figure 9:
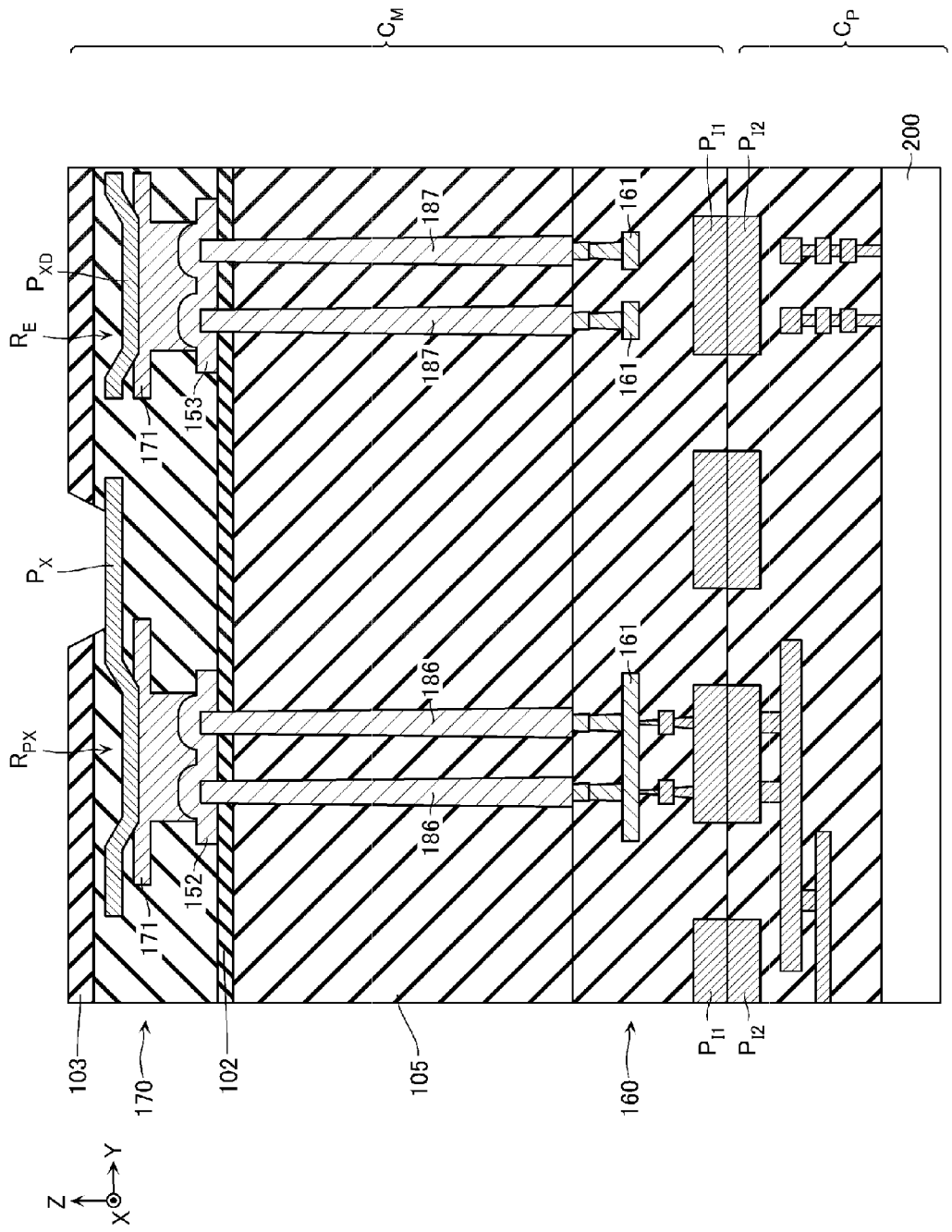
FIG. 9 is a schematic cross-sectional view illustrating a partial configuration of the chip $C_M$.

FIG. 2 is a schematic bottom view illustrating a configuration of the chip $C_M$. FIG. 3 is a schematic bottom view illustrating a configuration of portion designated by A in FIG. 2 in an enlarged manner. FIG. 4 is a schematic cross-sectional view of a structure illustrated in FIG. 3 taken along line B-B' and viewed along the direction of the arrow. FIG. 5 is a schematic cross-sectional view illustrating a configuration of portion designated by C in FIG. 4 in an enlarged manner. FIG. 6 is a schematic cross-sectional view of a structure illustrated in FIG. 3 taken along line D-D' and viewed along the direction of the arrow. FIG. 7 is a schematic cross-sectional view of a structure illustrated in FIG. 3 taken along lines E-E' and F-F' and viewed along the direction of the arrow. Furthermore, FIG. 7 also illustrates a structure in a memory cell array outer peripheral region $R_{MCAE}$ to be described below. FIG. 8 is a schematic cross-sectional view illustrating a partial configuration of the semiconductor storage device. FIG. 9 is a schematic cross-sectional view of a structure illustrated in FIG. 2 taken along line G-G' and viewed along the direction of the arrow.

[Structure of Chip $C_M$]

For example, as illustrated in FIG. 2, the chip $C_M$ includes four memory cell array regions $R_{MCA}$ arranged in the X and Y directions, a memory cell array outer peripheral region $R_{MCA}$ formed along the outer periphery of each memory cell array region $R_{MCA}$, a plurality of bonding pad electrode regions $R_P$ corresponding to the plurality of bonding pad electrodes $P_X$, and an edge seal region $R_E$ formed along the outer edge portion of the chip $C_M$.

The memory cell array area $R_{MCA}$ includes a plurality of memory blocks BLK arranged in the Y direction, a plurality of inter-block structures 140 (FIG. 3) provided respectively between these plurality of memory blocks BLK, and a conductive layer 150 (FIG. 4) formed on the upper surface of the plurality of memory blocks BLK and the plurality of inter-block structures 140. Further, a wiring layer 160 is formed below these plurality of memory blocks BLK. Further, a wiring layer 170 is formed above the conductive layer 150.

For example, as illustrated in FIG. 3, the memory block BLK includes a memory hole region $R_{MH}$, a through contact region $R_{180}$ formed at a position different from the memory hole region $R_{MH}$ in the X direction, and a hookup region $R_{190}$ formed at a position different from the memory hole region $R_{MH}$ and the through contact region $R_{180}$ in the X direction.

For example, as illustrated in FIG. 4, the memory hole region $R_{MH}$ of the memory block BLK includes a plurality of conductive layers 110 arranged in the Z direction, a plurality of semiconductor layers 120 extending in the Z direction, and a plurality of gate insulating films 130 formed respectively between the plurality of conductive layers 110 and the plurality of semiconductor layers 120.

The conductive layers 110 are a substantially plate-shaped conductive layer extending in the X direction. The conductive layers 110 function as, for example, word lines and gate electrodes of a plurality of memory cells connected thereto. The conductive layers 110 may contain a stacked film of a barrier conductive film such as titanium nitride (TiN) and a metal film such as tungsten (W). Further, the conductive layers 110 may contain, for example, polycrystalline silicon containing an N-type impurity such as phosphorus (P) or a P-type impurity such as boron (B). An insulating layer 101 such as silicon oxide ($SiO_2$) is formed between the plurality of conductive layers 110 arranged in the Z direction. Further, an insulating layer 102 such as silicon oxide ($SiO_2$) is formed on the upper surface of the conductive layer 110 located at the uppermost position. In the illustrated example, the thickness of the insulating layer 102 in the Z direction is larger than the thickness of the insulating layer 101 in the Z direction.

For example, as illustrated in FIG. 3, the semiconductor layers 120 are arranged in a predetermined pattern in the X direction and the Y direction. The semiconductor layers 120 function as, for example, channel regions of a plurality of memory cells. The semiconductor layers 120 are, for example, a semiconductor layer such as polycrystalline silicon (Si). For example, as illustrated in FIG. 4, the semiconductor layers 120 have a substantially bottomed cylindrical shape and are formed in the central portion thereof with an insulating layer 125 (FIG. 5) such as silicon oxide. Further, the outer peripheral surface of each semiconductor layer 120 is surrounded by the conductive layers 110, and faces the conductive layers 110.

An impurity region containing an N-type impurity such as phosphorus (P) is formed in the lower end portion of the semiconductor layer 120. This impurity region covers the lower end of the insulating layer 125. Further, this impurity region is electrically connected to a bit line BL in the wiring layer 160. The bit line BL is electrically connected to a configuration in the chip $C_P$ via the first laminated electrode $P_{I1}$ described above.

An impurity region containing an N-type impurity such as phosphorus (P) or a P-type impurity such as boron (B) is formed in the upper end portion of the semiconductor layer 120. This impurity region is formed in a substantially cylindrical shape. The upper end portion is located above the upper surface of the insulating layer 102 and the upper end of the insulating layer 125. Further, a part of the outer peripheral surface of this impurity region is in contact with the gate insulating film 130, and a part thereof located above that part is bonded to the conductive layer 150. Further, a part of the inner peripheral surface of this impurity region is in contact with the insulating layer 125, and a part thereof located above that part is bonded to the conductive layer 150. Further, the upper end of this impurity region is bonded to the conductive layer 150.

The gate insulating film 130 has a substantially cylindrical shape that covers the outer peripheral surface of the semiconductor layer 120. For example, as illustrated in FIG. 5, the gate insulating film 130 includes a tunnel insulating film 131, a charge storage film 132, and a block insulating film 133 stacked between the semiconductor layer 120 and the conductive layer 110. The tunnel insulating film 131 and the block insulating film 133 are, for example, an insulating film such as silicon oxide ($SiO_2$). The charge storage film 132 is, for example, a film capable of storing charges such as silicon nitride ($Si_3N_4$). The tunnel insulating film 131, the charge storage film 132, and the block insulating film 133 have a substantially cylindrical shape, and extend in the Z direction along the outer peripheral surface of the semiconductor layer 120.

Furthermore, FIG. 5 illustrates an example in which the gate insulating film 130 includes the charge storage film 132 such as silicon nitride. The gate insulating film 130, however, may include, for example, a floating gate such as polycrystalline silicon containing an N-type or P-type impurity.

For example, as illustrated in FIG. 4, each inter-block structure 140 includes a conductive layer 141 extending in the Z direction and the X direction and an insulating layer 142 such as silicon oxide ($SiO_2$) formed on the side surface in the Y direction of the conductive layer 141. The conductive layer 141 may contain a stacked film of a barrier conductive film such as titanium nitride (TiN) and a metal film such as tungsten (W). The conductive layer 141 functions as, for example, a part of source lines. Furthermore, the upper end portion of the conductive layer 141 may be located above the upper surface of the insulating layer 102. Further, both side surfaces in the X direction and the upper end of the upper end portion of the conductive layer 141 are bonded to the conductive layer 150.

The conductive layer 150 may contain, for example, a stacked film of a barrier conductive film such as titanium nitride (TiN) and a metal film such as tungsten (W). Further, the conductive layer 150 may contain, for example, polycrystalline silicon containing an N-type impurity such as phosphorus (P) or a P-type impurity such as boron (B). The conductive layer 150 functions, for example, as apart of source lines.

The conductive layer 150 is in contact with the upper surface of the insulating layer 102, the upper end portion of the semiconductor layer 120, the upper end of the insulating layer 125, and the upper end portion of the conductive layer 141. A portion of the conductive layer 150 that covers the upper surface of the insulating layer 102 is formed substantially flat along the surface of the insulating layer 102. Further, a portion of the conductive layer 150 that covers the upper end portion of the semiconductor layer 120 and the upper end of the insulating layer 125 protrudes upward along the shape of the upper end portion of the semiconductor layer 120. Such protruding portions are formed in the X direction and the Y direction to correspond to each semiconductor layer 120. Further, a portion of the conductive layer 150 that covers the upper end portion of the conductive layer 141 protrudes upward along the shape of the upper end portion of the conductive layer 141. Such protruding portions are formed in the Y direction to correspond to each conductive layer 141, and extends in the X direction.

For example, as illustrated in FIG. 3, the through contact region $R_{180}$ of the memory block BLK includes two wiring regions $R_{181}$ arranged in the Y direction, a small through contact area R182 provided between the two wiring regions $R_{181}$, and an insulating layer 180 such as silicon oxide (SiO$_2$) formed between each wiring region $R_{181}$ and the small through contact region $R_{182}$.

For example, as illustrated in FIG. 6, the wiring region $R_{181}$ of the memory block BLK includes a plurality of the conductive layers 110 arranged in the Z direction. The side surfaces in the Y direction of these plurality of conductive layers 110 are in contact with the insulating layer 180, respectively. These plurality of conductive layers 110 are, for example, a part of the plurality of conductive layers 110 formed in the memory hole region $R_{MH}$ as illustrated in FIG. 3. Furthermore, as illustrated in FIG. 6, in the wiring region $R_{181}$, a part of the conductive layer 150 is formed on the upper surface of the insulating layer 102.

For example, as illustrated in FIG. 6, the small through contact region $R_{182}$ of the memory block BLK includes a plurality of insulating layers 110A arranged in the Z direction and a contact 181 extending in the Z direction. Further, a conductive layer 151 may be formed in the small through contact region $R_{182}$ of the memory block BLK.

The insulating layers 110A are a substantially plate-shaped insulating layer extending in the X direction. The side surfaces in the Y direction of these plurality of insulating layers 110A are in contact with the insulating layer 180, respectively. The insulating layers 110A are, for example, an insulating layer such as silicon nitride (Si$_3$N$_4$). The insulating layer 101 such as silicon oxide (SiO$_2$) is formed between the plurality of insulating layers 110A arranged in the Z direction. Further, the insulating layer 102 such as silicon oxide (SiO$_2$) may be formed on the upper surface of the insulating layer 110A located at the uppermost position.

For example, as illustrated in FIG. 3, the contacts 181 are arranged at predetermined intervals in the X direction. The contact 181 may contain a stacked film of a barrier conductive film such as titanium nitride (TiN) and a metal film such as tungsten (W). For example, as illustrated in FIG. 6, the contact 181 is electrically connected to a configuration in the chip $C_P$ via a wiring 161 in the wiring layer 160 and the first laminated electrode $P_{I1}$. Furthermore, the upper end portion of the contact 181 is located above the surface of the insulating layer 102. Further, the upper end and the outer peripheral surface of the upper end portion of the contact 181 are in contact with the conductive layer 151. The contact 181 is electrically connected to, for example, the bonding pad electrode $P_X$ via the conductive layer 151 and a wiring 171 in the wiring layer 170.

The conductive layer 151 is basically configured in the same manner as the conductive layer 150. However, the conductive layer 151 is electrically independent of the conductive layer 150. Further, the conductive layer 151 is in contact with the upper surface of the insulating layer 102 and the upper end portion of the contact 181. A portion of the conductive layer 151 that covers the upper surface of the insulating layer 102 is formed substantially flat along the upper surface of the insulating layer 102. Further, a portion of the conductive layer 151 that covers the upper end portion of the contact 181 protrudes upward along the shape of the upper end portion of the contact 181. The conductive layers 151 are formed in the X direction to correspond to each contact 181.

For example, as illustrated in FIG. 7, the hookup region $R_{190}$ of the memory block BLK includes a plurality of the conductive layers 110 arranged in the Z direction and contacts 191 extending in the Z direction.

For example, the plurality of conductive layers 110 of the hookup region $R_{190}$ are apart of the plurality of conductive layers 110 formed in the memory hole region $R_{MH}$ as illustrated in FIG. 3. For example, as illustrated in FIG. 7, each of the plurality of conductive layers 110 includes a region that overlaps with at least one of the conductive layers 110 located thereunder when viewed in the Z direction and a region that does not overlap with any of the conductive layers 110 located thereunder. Hereinafter, such a structure may be referred to as a substantially stepped structure.

For example, as illustrated in FIG. 3, the contacts 191 are arranged at predetermined intervals in the X direction and the Y direction. The contacts 191 may contain, for example, a stacked film of a barrier conductive film such as titanium nitride (TiN) and a metal film such as tungsten (W). For example, as illustrated in FIG. 7, the lower end portion of each contact 191 is electrically connected to a configuration in the chip $C_P$ via the wiring 161 in the wiring layer 160 and the first laminated electrode $P_{I1}$. Further, the upper end portion of the contact 191 is in contact with a part of the corresponding conductive layer 110.

For example, as illustrated in FIG. 7, the memory cell array outer peripheral region $R_{MCAE}$ includes a part of the insulating layer 102. For example, as illustrated in FIG. 7, the insulating layer 102 includes a portion 102I formed inside the memory cell array region $R_{MCA}$ and a portion 102O formed outside the memory cell array region $R_{MCA}$. The thickness of the portion 102O in the Z direction is smaller than the thickness of the portion 102I in the Z direction. Further, a step 102S is formed at a connecting portion between the portion 102I and the portion 102O. The step 102S is formed, for example, along the outer edge of the memory cell array region $R_{MCA}$.

Further, for example, as illustrated in FIG. 8, the memory cell array outer peripheral region $R_{MCAE}$ includes a contact 185 extending in the Z direction. The contact 185 may contain, for example, a stacked film of a barrier conductive film such as titanium nitride (TiN) and a metal film such as tungsten (W). The contact 185 is electrically connected to a configuration in the chip $C_P$ via the wiring 161 in the wiring layer 160 and the first laminated electrode $P_{I1}$. Further, the upper end portion of the contact 185 is in contact with the conductive layer 150. Furthermore, the position of the contact 185 may be adjusted as appropriate.

For example, as illustrated in FIG. 9, the bonding pad electrode region $R_{PX}$ includes a contact 186 extending in the Z direction, a conductive layer 152 in contact with the upper end portion of the contact 186, and the bonding pad electrode $P_X$ electrically connected to the conductive layer 152.

The contact 186 may contain, for example, a stacked film of a barrier conductive film such as titanium nitride (TiN) and a metal film such as tungsten (W). The contact 186 is electrically connected to a configuration in the chip $C_P$ via the wiring 161 in the wiring layer 160 and the first laminated electrode $P_{I1}$. Further, the upper end portion of the contact 186 may be in contact with the conductive layer 152.

The conductive layer 152 is substantially configured in the same manner as the conductive layer 150. The conductive layer 152, however, is electrically independent of the conductive layer 150. Further, the conductive layer 152 is in contact with the upper surface of the insulating layer 102 and the upper end portion of the contact 186. A portion of the conductive layer 152 that covers the upper surface of the insulating layer 102 is formed substantially flat along the upper surface of the insulating layer 102. Further, a portion of the conductive layer 152 that covers the upper end portion of the contact 186 protrudes upward along the shape of the upper end portion of the contact 186. The conductive layers 152 are formed in the X direction to correspond to each bonding pad electrode $P_X$.

The bonding pad electrode $P_X$ may contain, for example, a stacked film of a barrier conductive film such as titanium nitride (TiN) and a metal film such as aluminum (Al). A part of the upper surface of the bonding pad electrode $P_X$ is covered with an insulating layer 103 such as polyimide. Further, a part of the upper surface of the bonding pad electrode $P_X$ is exposed to the outside of the memory die MD through an opening formed in the insulating layer 103. Further, a part of the lower surface of the bonding pad electrode $P_X$ is in contact with the wiring 171 in the wiring layer 170. The bonding pad electrode $P_X$ is electrically connected to a configuration in the chip $C_P$ via the wiring 171, the conductive layer 152, and the contact 186.

For example, as illustrated in FIG. 9, the edge seal region $R_E$ includes a contact 187 extending in the Z direction, a conductive layer 153 in contact with the upper end portion of the contact 187, and a dummy electrode $P_{XD}$ electrically connected to the conductive layer 153. The contact 187, the conductive layer 153, and the dummy electrode $P_{XD}$ are configured substantially in the same manner as the contact 186, the conductive layer 152, and the bonding pad electrode $P_X$, respectively. However, the contact 187, the conductive layer 153, and the dummy electrode $P_{XD}$ are provided for convenience in a manufacturing process, and do not function as a part of the memory cell array or a part of the peripheral circuit. The contact 187, the conductive layer 153, and the dummy electrode $P_{XD}$ may not be electrically connected to a configuration in the chip $C_P$.

[Structure of Chip $C_P$]

For example, as illustrated in FIG. 4, the chip $C_P$ includes a semiconductor substrate 200 and a plurality of transistors Tr provided on the surface of the semiconductor substrate 200. The plurality of transistors Tr are connected to a configuration in the chip $C_M$ via the second laminated electrodes $P_{t2}$ described above, and function as the peripheral circuit used for the control of the memory cell array. In a read operation, for example, this peripheral circuit supplies a voltage to a current path including the bit line BL, the semiconductor layer 120, the conductive layer 150, and the conductive layer 141, and determines data recorded in the memory cell according to whether or not current flows.

[Manufacturing Method]

Figure 10:
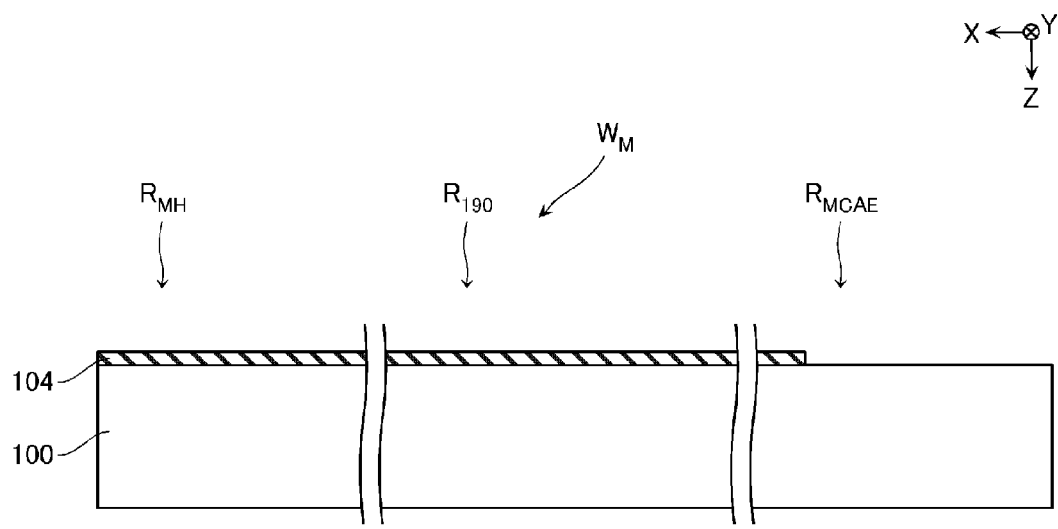
FIG. 10 is a schematic cross-sectional view illustrating a method of manufacturing the semiconductor storage device according to the first embodiment.

Next, a method of manufacturing the memory die MD will be described with reference to FIGS. 10 to 28. FIG. 10 to are schematic cross-sectional views illustrating the manufacturing method. FIGS. 12, 16 to 22, 24, 26 and 28 illustrate the cross section corresponding to FIG. 4. FIGS. 10, 11, 13 to 15, 23, 25 and 27 illustrate the cross section corresponding to FIG. 7.

In the manufacture of the memory die MD according to at least one embodiment, for example, as illustrated in FIG. 10, an insulating layer 104 such as silicon oxide ($SiO_2$) is formed on a semiconductor substrate 100 of a wafer $W_M$. In this process, the insulating layer 104 is formed by, for example, a method such as chemical vapor deposition (CVD). Further, the insulating layer 104 is removed in a region outside the memory cell array region $R_{MCA}$ by a method such as reactive ion etching (RIE) or wet etching.

Figure 11:
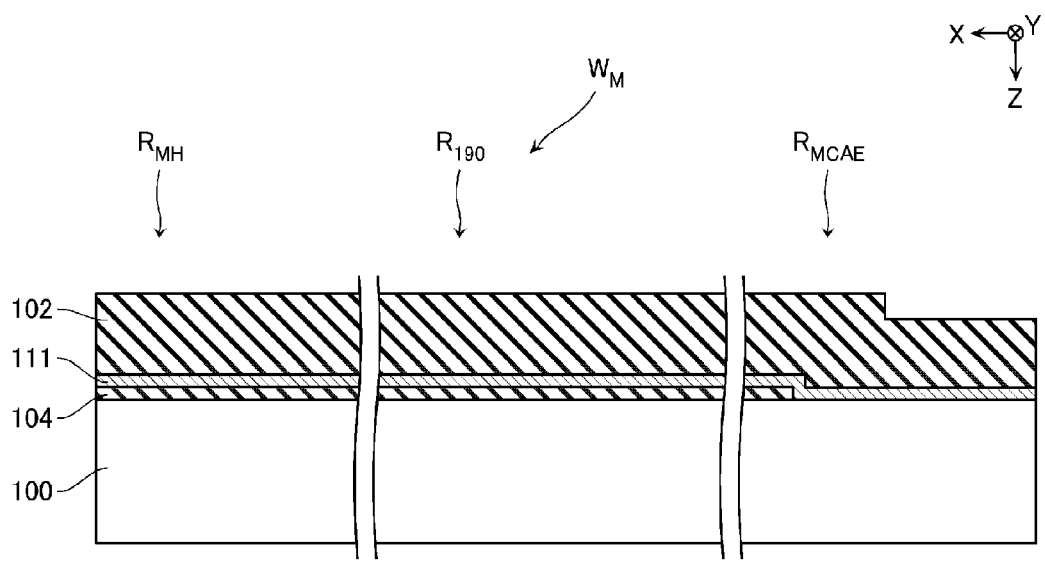
FIG. 11 is a schematic cross-sectional view illustrating the manufacturing method.

Next, for example, as illustrated in FIG. 11, a conductive layer 111 and the insulating layer 102 are formed on the upper surfaces of the insulating layer 104 and the semiconductor substrate 100. The conductive layer 111 may contain, for example, a stacked film of a barrier conductive film such as titanium nitride (TiN) and a metal film such as tungsten (W). Further, the conductive layer 111 may contain, for example, polycrystalline silicon containing an N-type impurity such as phosphorus (P) or a P-type impurity such as boron (B). This process is performed by, for example, a method such as CVD.

Figure 12:
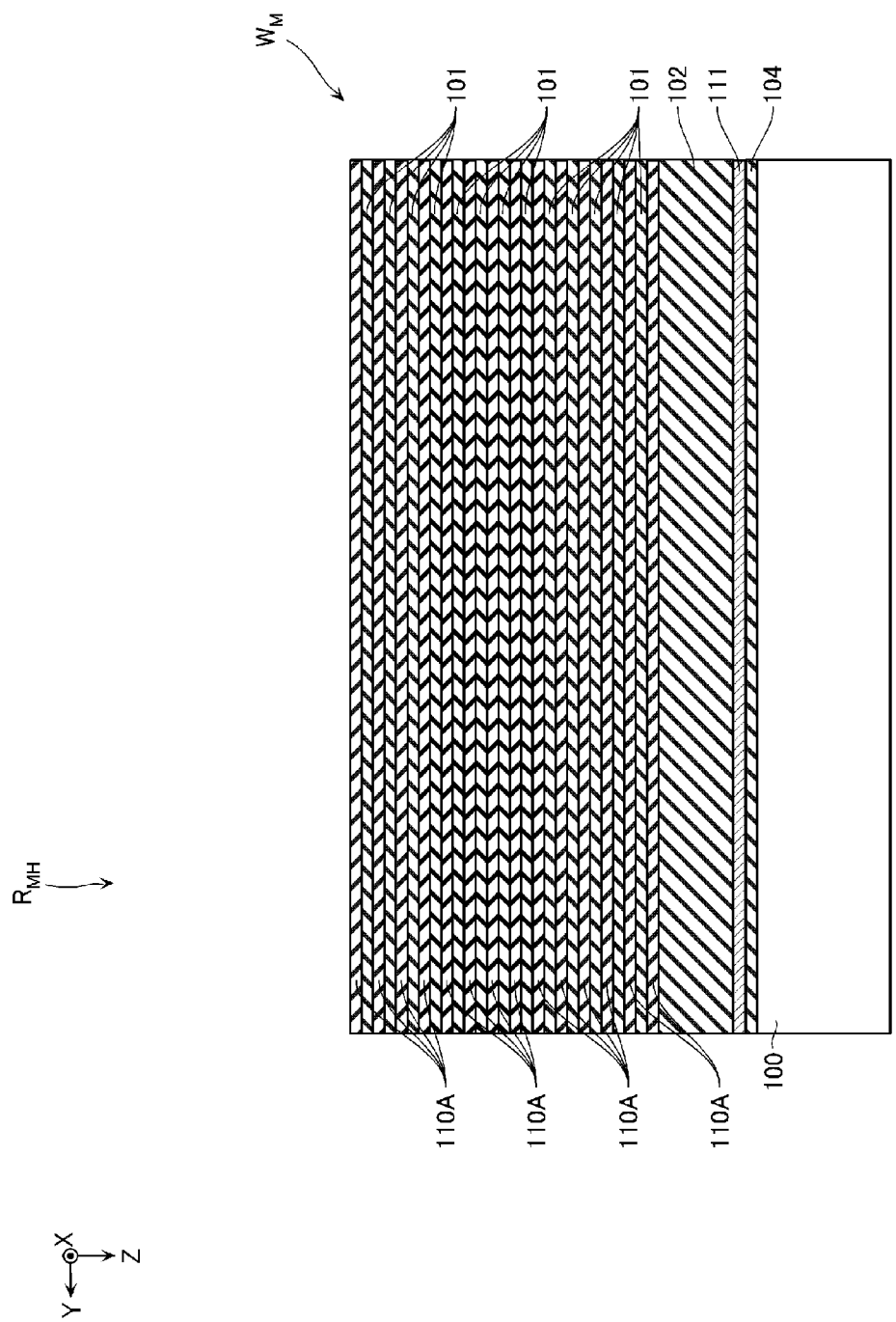
FIG. 12 is a schematic cross-sectional view illustrating the manufacturing method.
Figure 13:
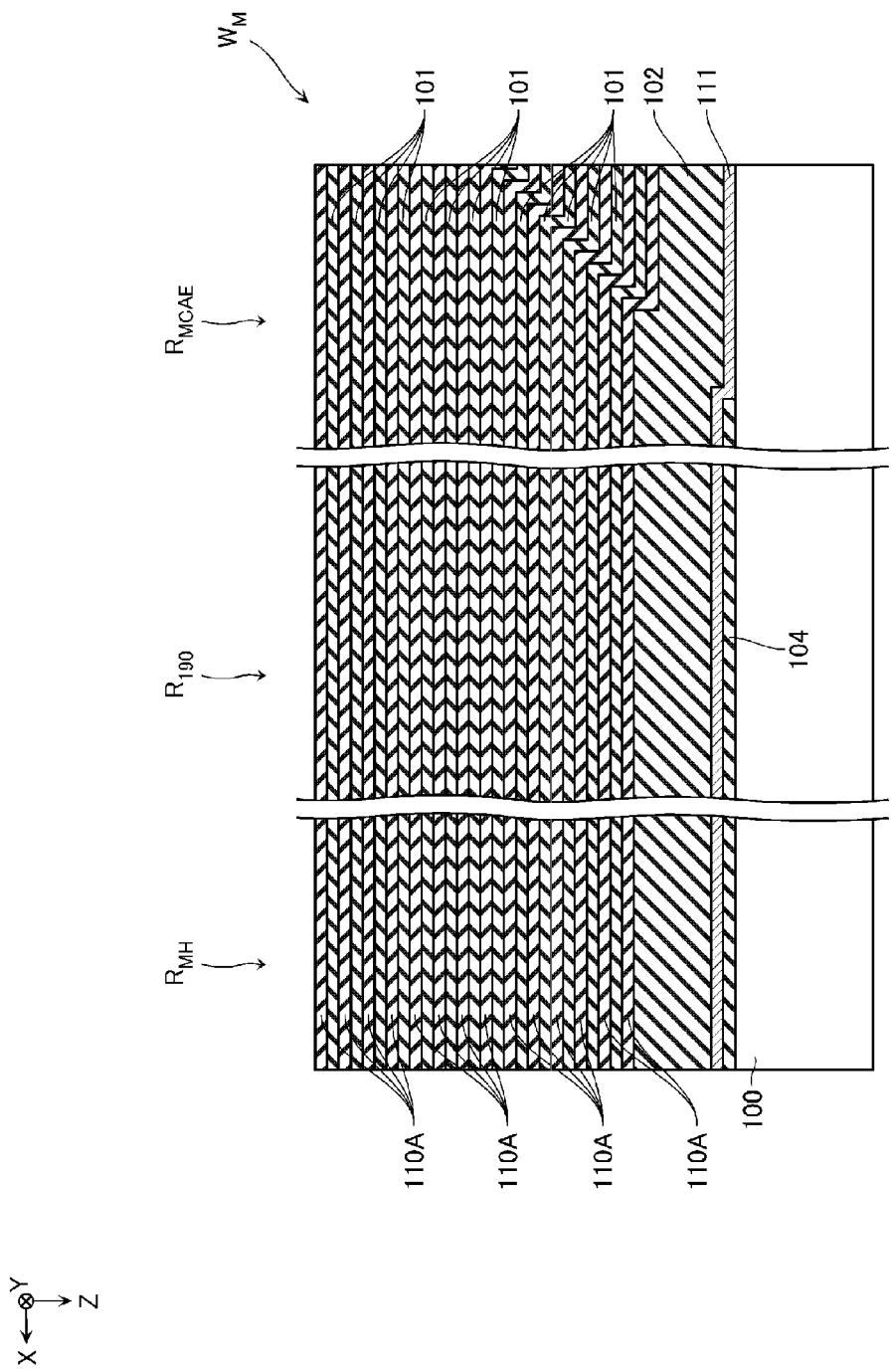
FIG. 13 is a schematic cross-sectional view illustrating the manufacturing method.

Next, for example, as illustrated in FIGS. 12 and 13, a plurality of insulating layers 110A and insulating layers 101 are formed on the upper surface of the insulating layer 102. This process is performed by, for example, a method such as CVD.

Figure 14:
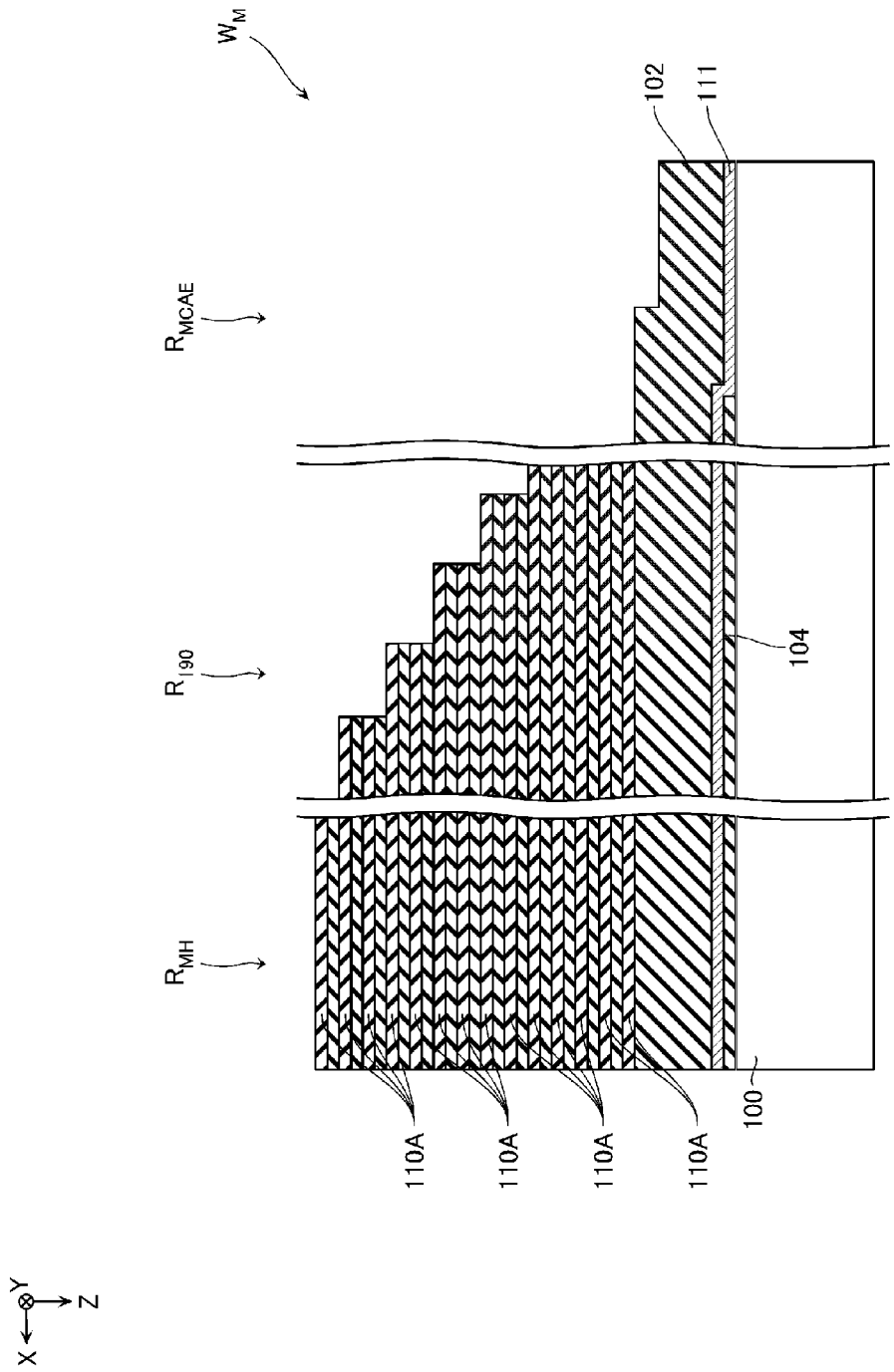
FIG. 14 is a schematic cross-sectional view illustrating the manufacturing method.

Next, for example, as illustrated in FIG. 14, a part of the plurality of insulating layers 110A and insulating layers 101 is removed to form a substantially stepped structure. In this process, for example, a resist covering the memory cell array region $R_{MCA}$ (FIG. 2) is formed. Next, a part of the insulating layers 110A is selectively removed by a method such as RIE or wet etching using the resist as a mask. Next, a part of the insulating layers 101 is selectively removed by a method such as RIE or wet etching using the resist as a mask. Next, a part of the resist is isotropically removed by a method such as wet etching. Similarly, a part of the insulating layers 110A, a part of the insulating layers 101, and a part of the resist are sequentially removed.

Figure 15:
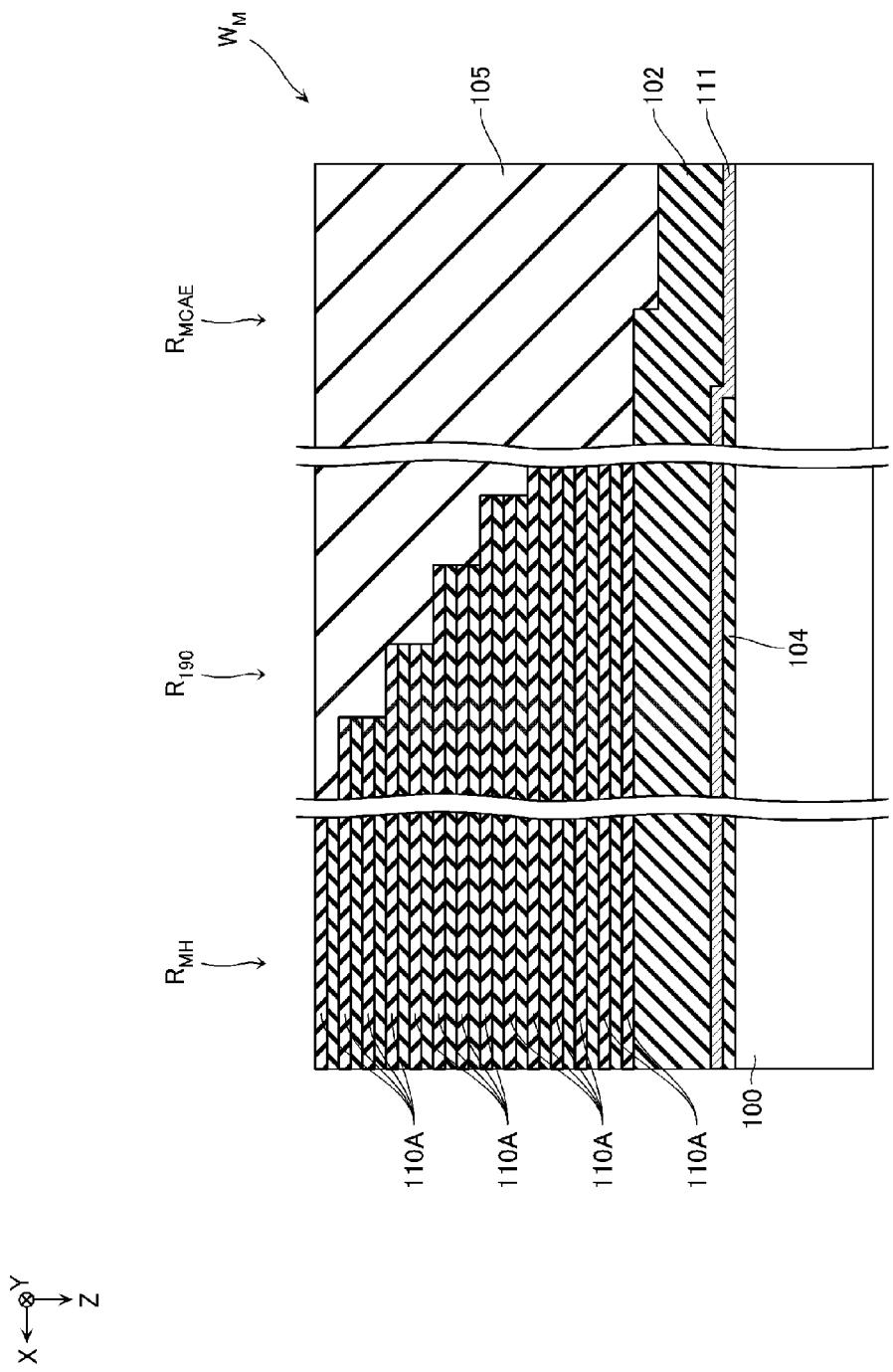
FIG. 15 is a schematic cross-sectional view illustrating the manufacturing method.

Next, for example, as illustrated in FIG. 15, an insulating layer 105 such as silicon oxide ($SiO_2$) is formed on the upper surface of the stepped structure as illustrated in FIG. 14. This process is performed by, for example, a method such as CVD.

Figure 16:
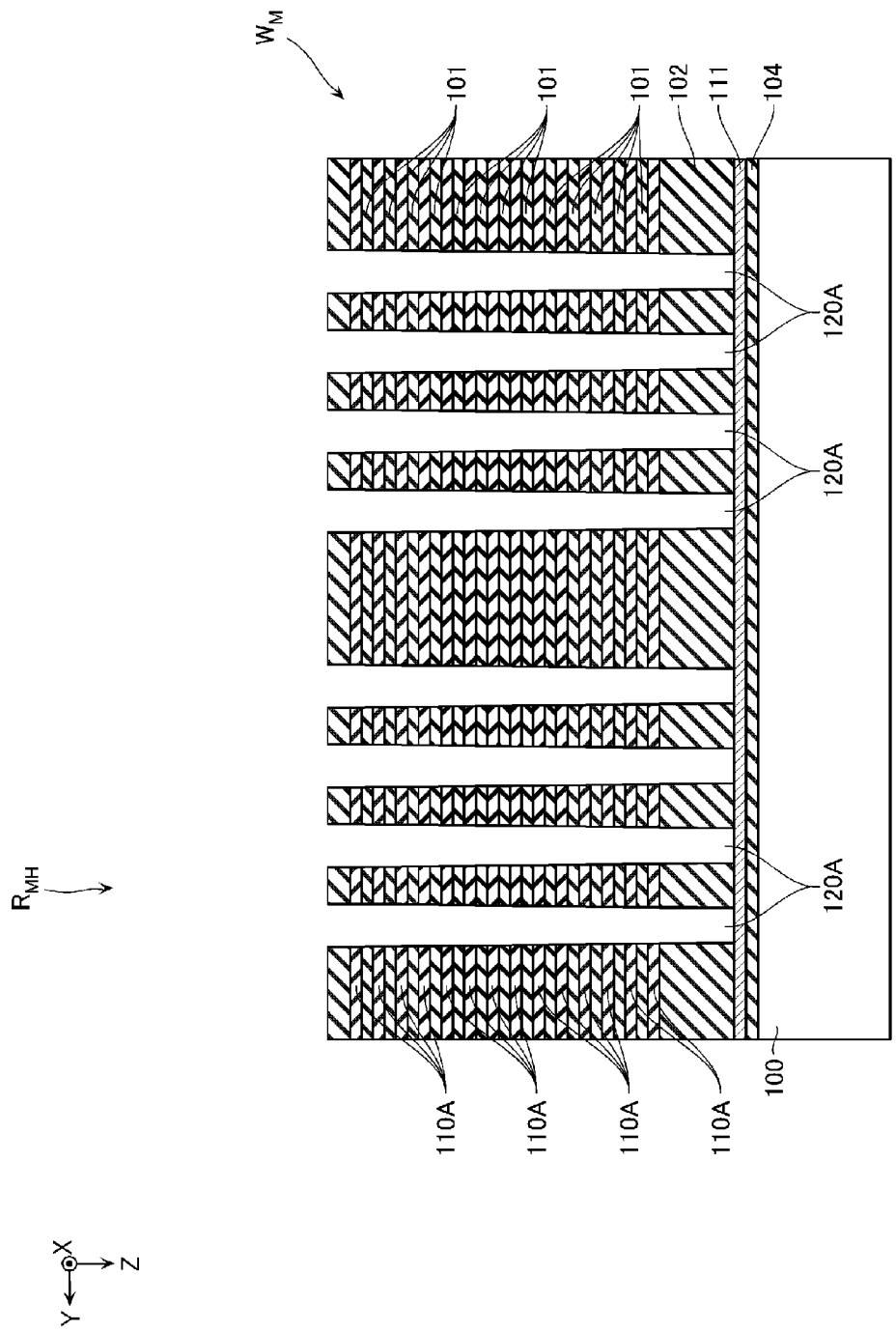
FIG. 16 is a schematic cross-sectional view illustrating the manufacturing method.

Next, for example, as illustrated in FIG. 16, a plurality of through via holes 120A are formed at positions corresponding to the semiconductor layers 120. The through via holes 120A are through via holes that extend in the Z direction and penetrate the insulating layers 101 and the insulating layers 110A to expose the upper surface of the conductive layer 111. This process is performed by, for example, a method such as RIE.

Figure 17:
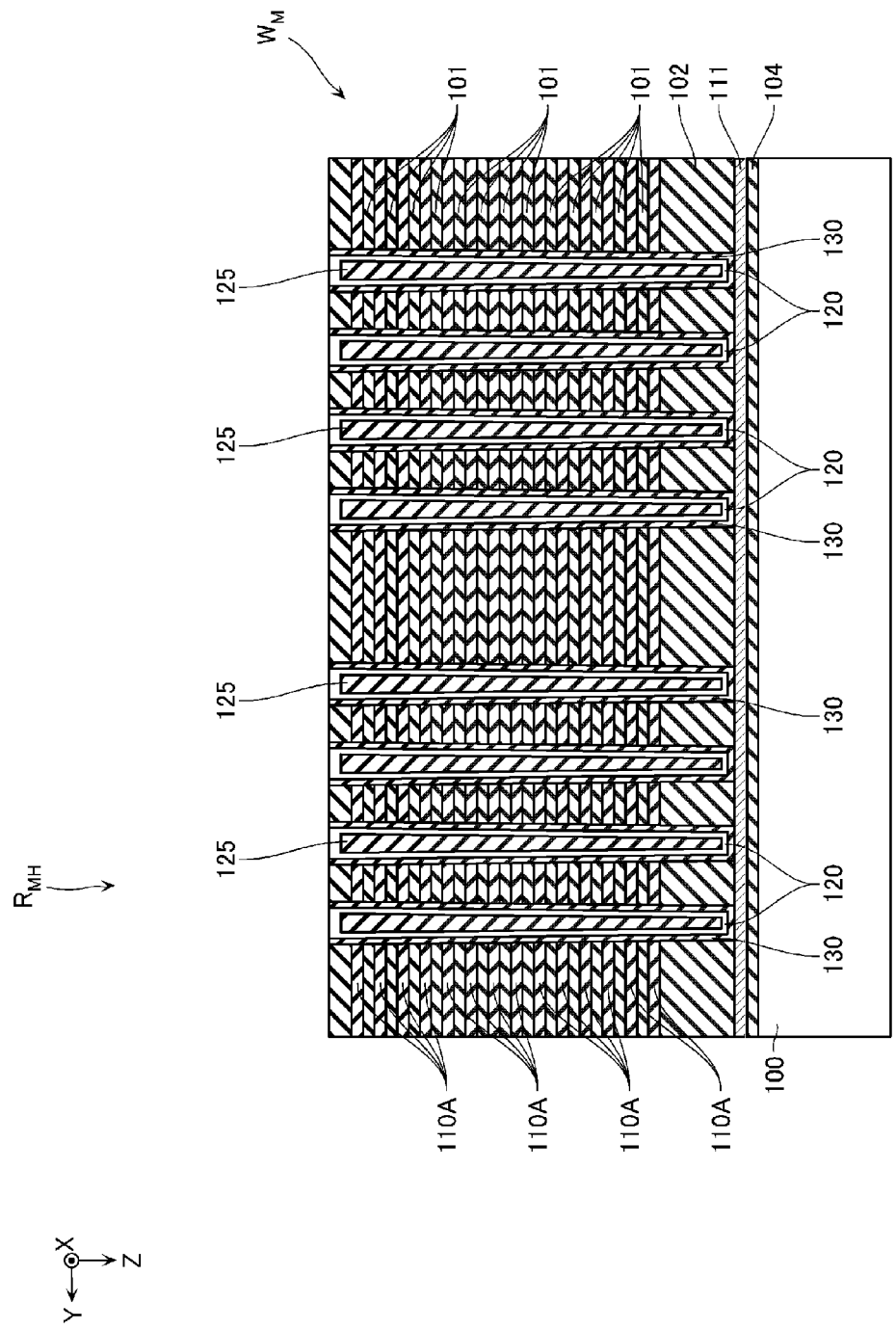
FIG. 17 is a schematic cross-sectional view illustrating the manufacturing method.

Next, for example, as illustrated in FIG. 17, the gate insulating film 130, the semiconductor layer 120, and the insulating layer 125 are formed on the inner peripheral surface of each through via hole 120A. This process is performed by, for example, a method such as CVD.

Figure 18:
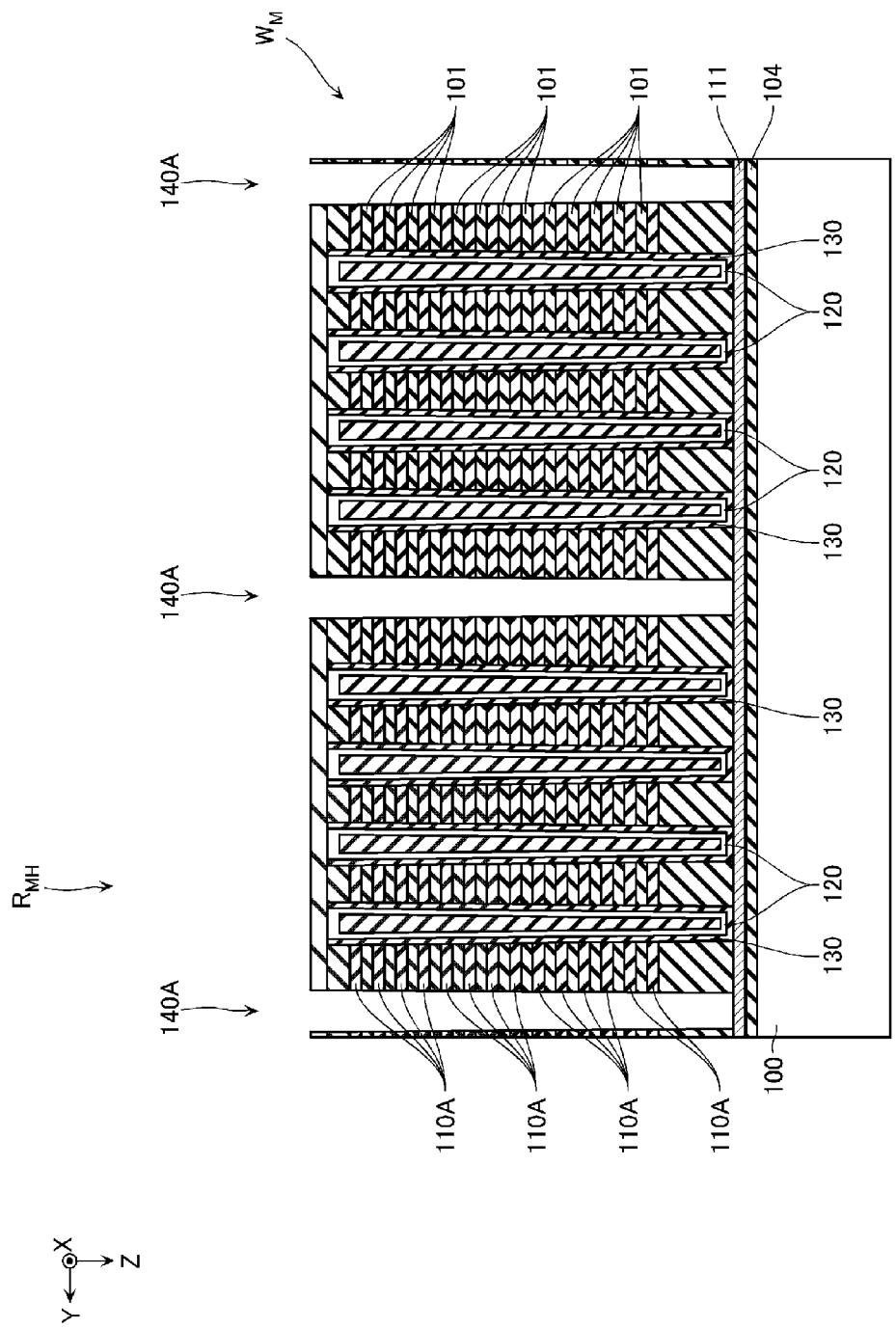
FIG. 18 is a schematic cross-sectional view illustrating the manufacturing method.

Next, for example, as illustrated in FIG. 18, grooves 140A are formed. The grooves 140A are grooves that extend in the Z direction and the X direction and divide the insulating layers 101 and the insulating layers 110A in the Y direction to expose the upper surface of the conductive layer 111. This process is performed by, for example, a method such as RIE.

Figure 19:
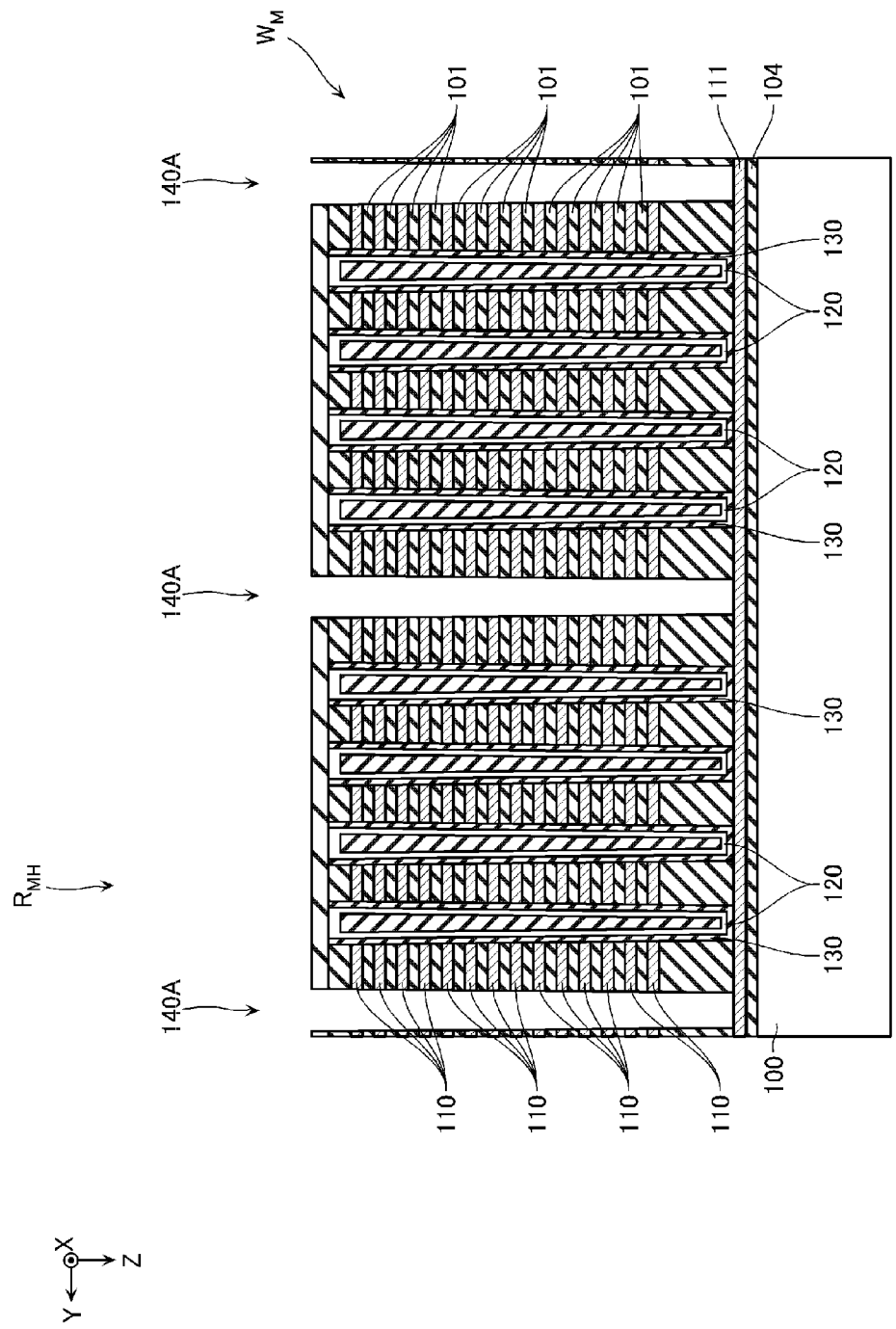
FIG. 19 is a schematic cross-sectional view illustrating the manufacturing method.

Next, for example, as illustrated in FIG. 19, the conductive layers 110 are formed. In this process, the insulating layers 110A are removed through the grooves 140A by, for example, a method such as wet etching. Further, the conductive layers 110 are formed by a method such as CVD.

Figure 20:
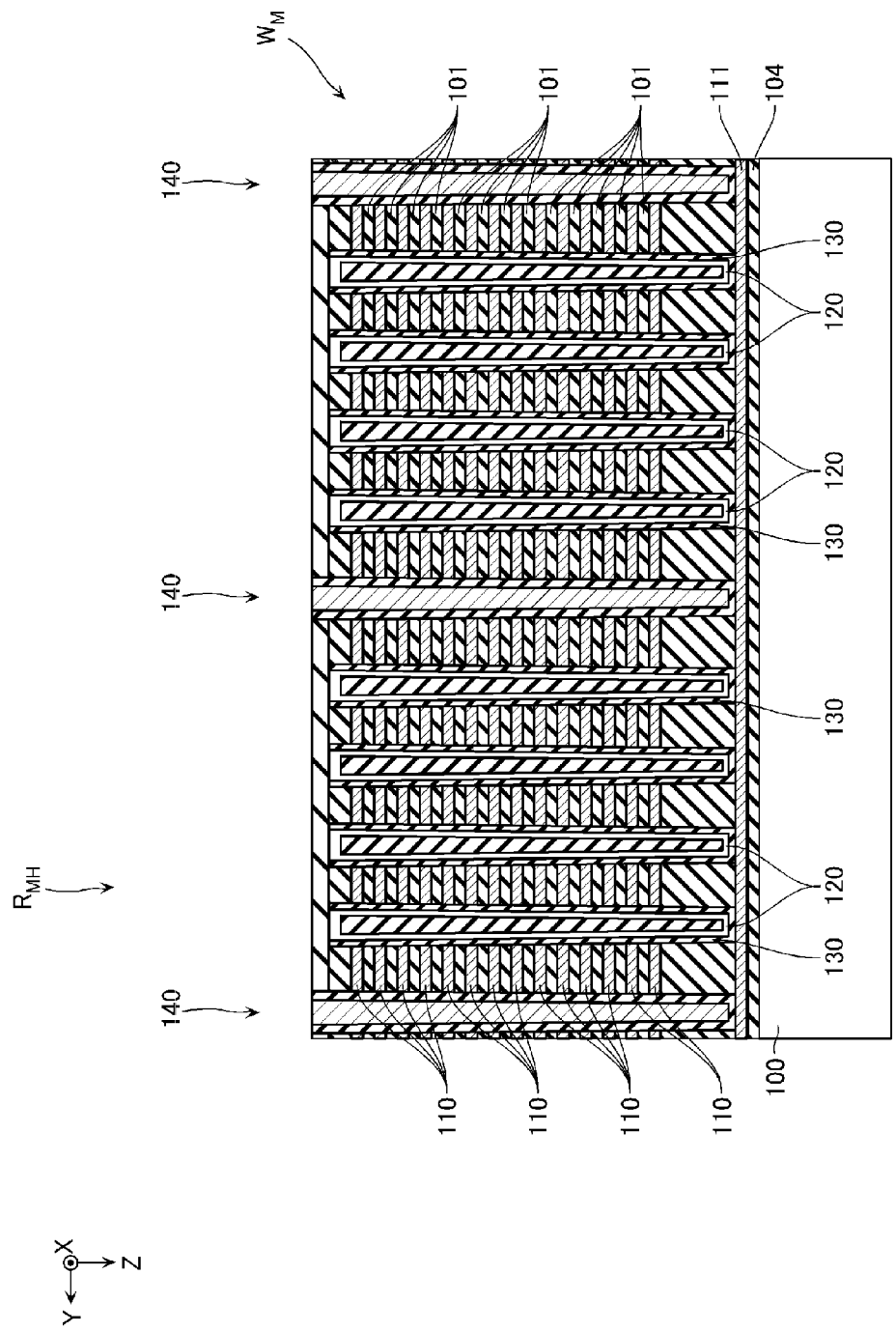
FIG. 20 is a schematic cross-sectional view illustrating the manufacturing method.

Next, for example, as illustrated in FIG. 20, the inter-block structures 140 are formed in the grooves 140A. This process is performed by, for example, a method such as CVD or RIE.

Figure 21:
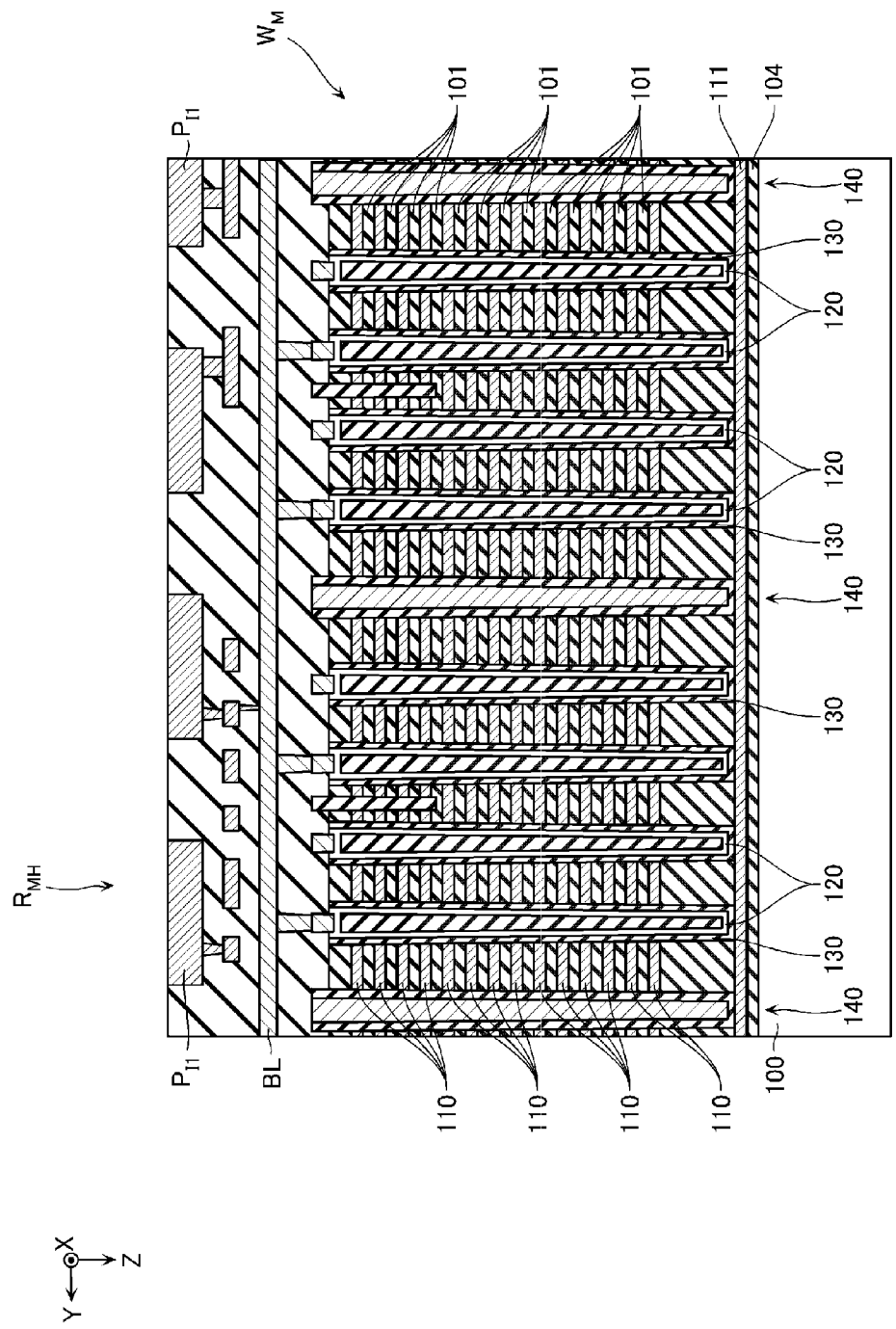
FIG. 21 is a schematic cross-sectional view illustrating the manufacturing method.

Next, for example, as illustrated in FIG. 21, the wiring layer 160 (bit line BL) and the first laminated electrodes $P_{t1}$ are formed. This process is performed by, for example, a method such as CVD, photolithography, or etching.

Figure 22:
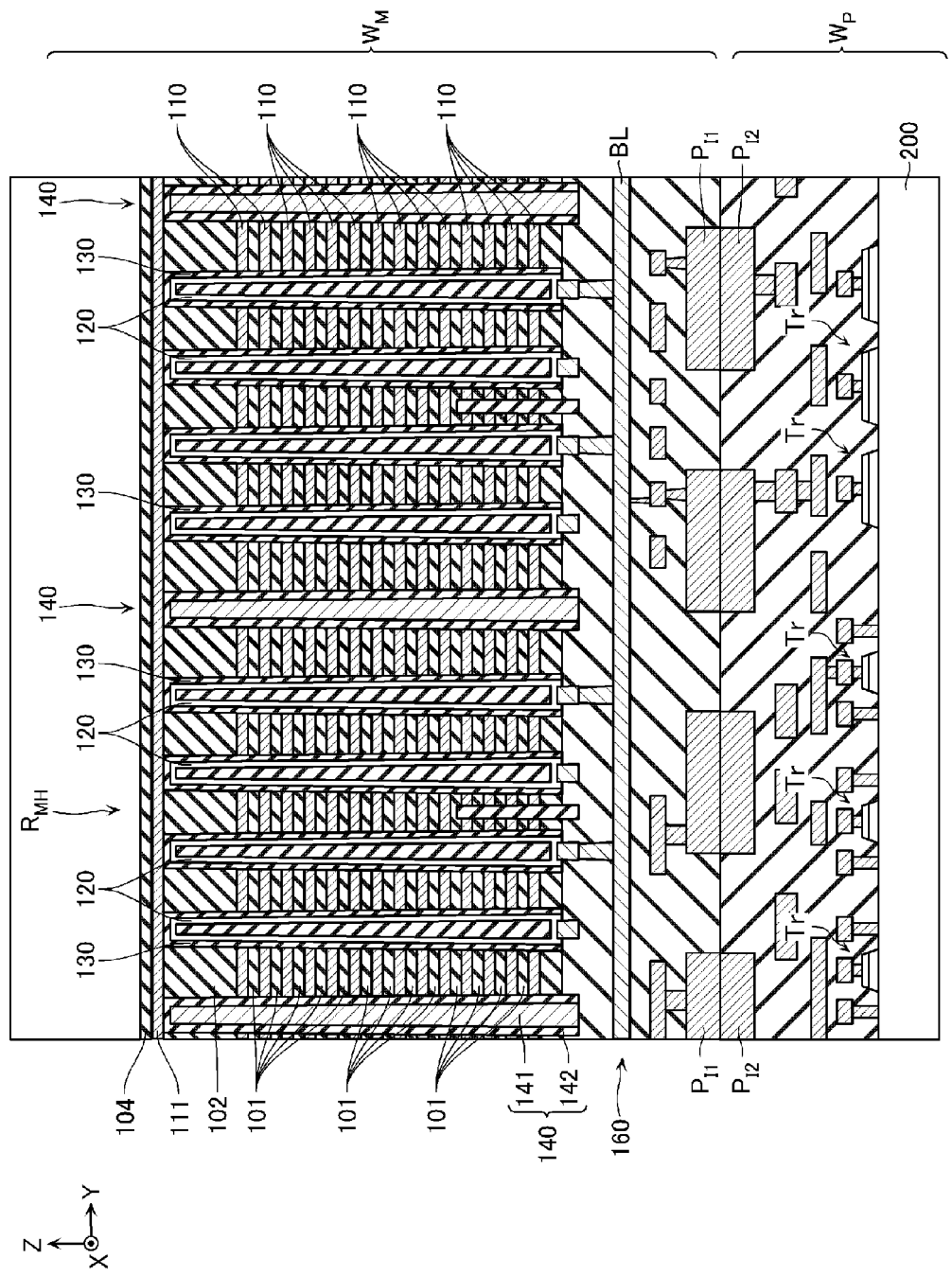
FIG. 22 is a schematic cross-sectional view illustrating the manufacturing method.
Figure 23:
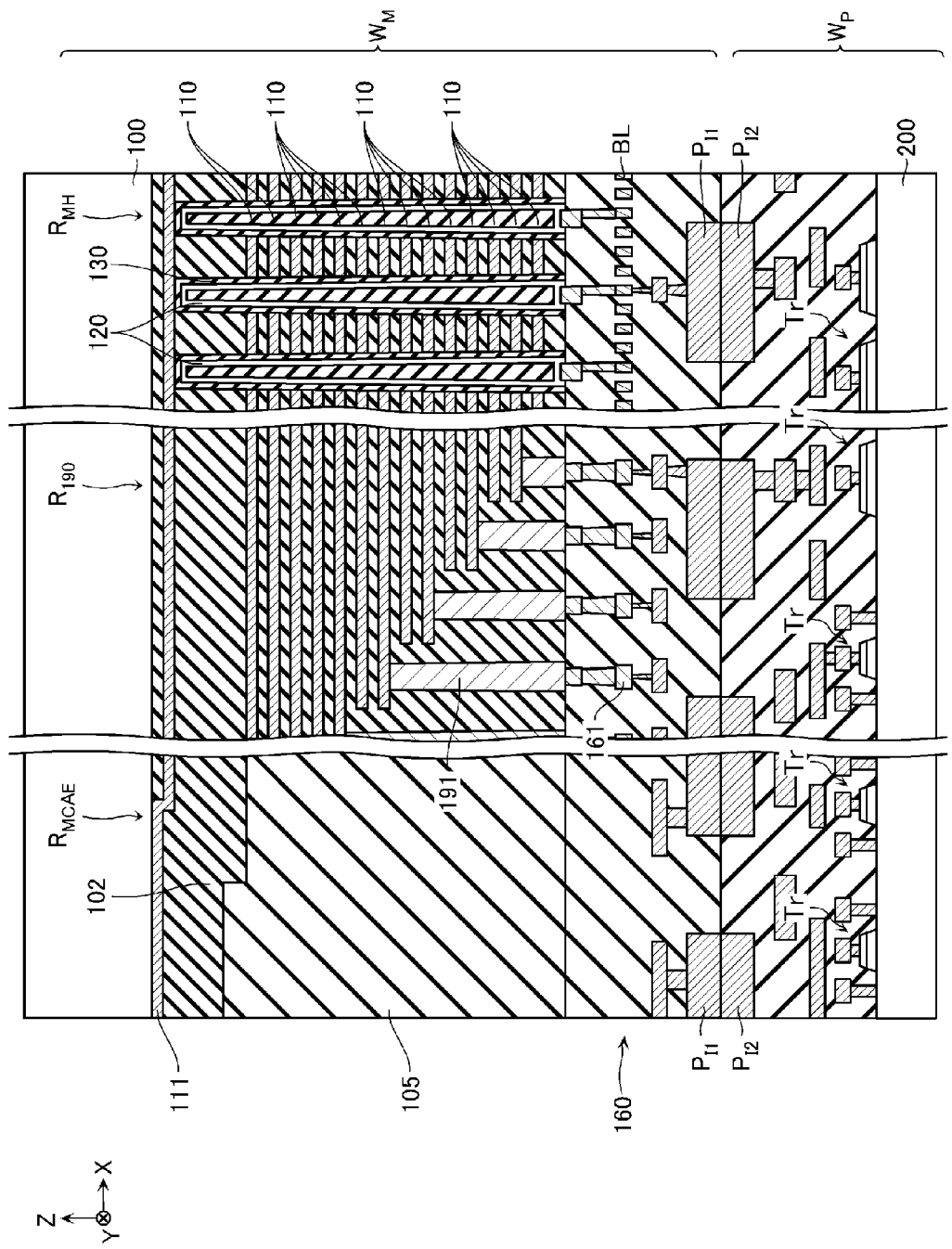
FIG. 23 is a schematic cross-sectional view illustrating the manufacturing method.

Next, for example, as illustrated in FIGS. 22 and 23, the wafer $W_M$ corresponding to the chip $C_M$ is laminated on a wafer $W_P$ corresponding to the chip $C_P$. In this lamination process, for example, the wafer $W_M$ is strongly pressed against the wafer $W_P$ so as to be in close contact with the wafer $W_P$, and is subjected to a heat treatment. Thus, the wafer $W_M$ is laminated on the wafer $W_P$ via the first laminated electrodes $P_{I1}$ and the second laminated electrodes $P_{I2}$.

Figure 24:
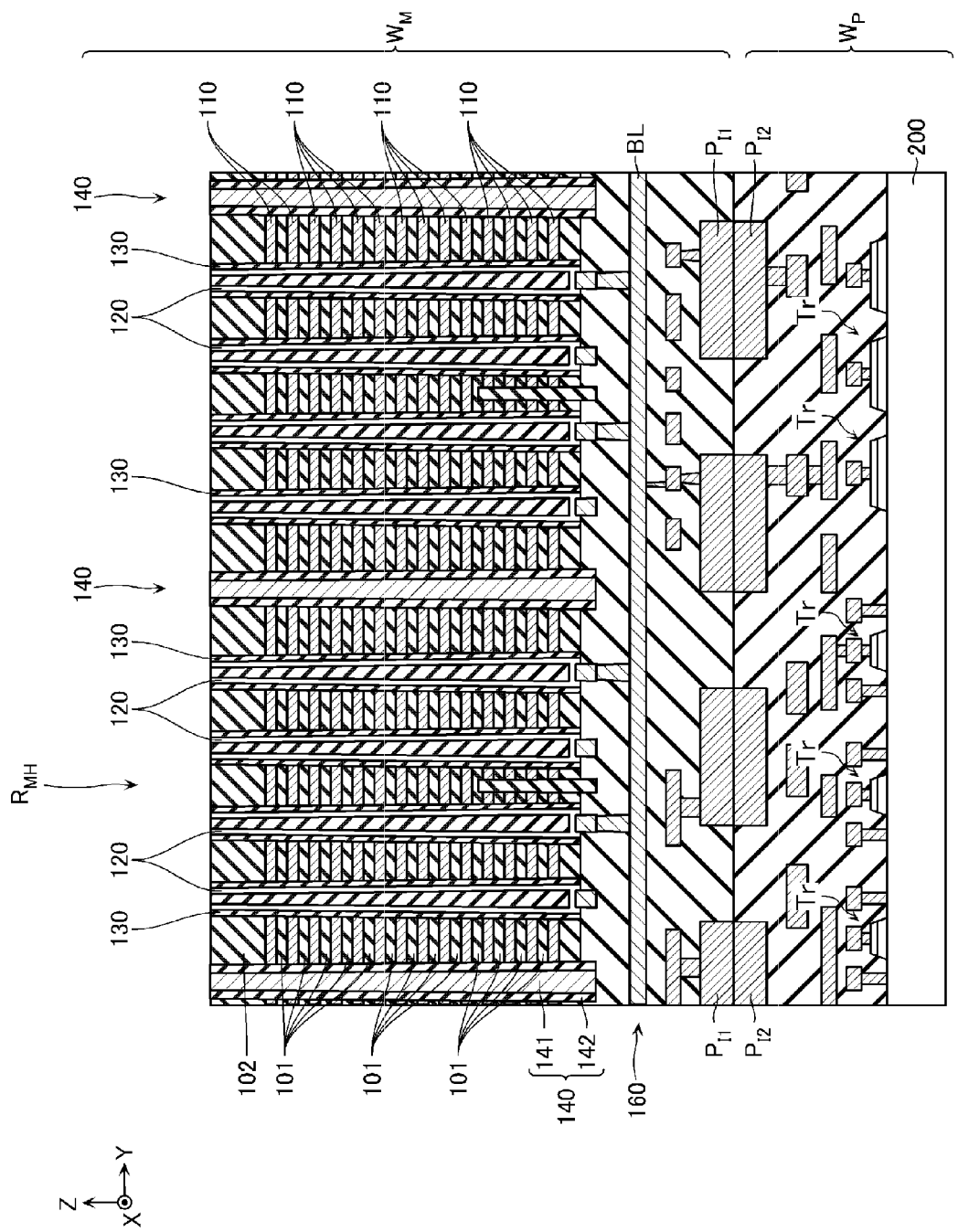
FIG. 24 is a schematic cross-sectional view illustrating the manufacturing method.
Figure 25:
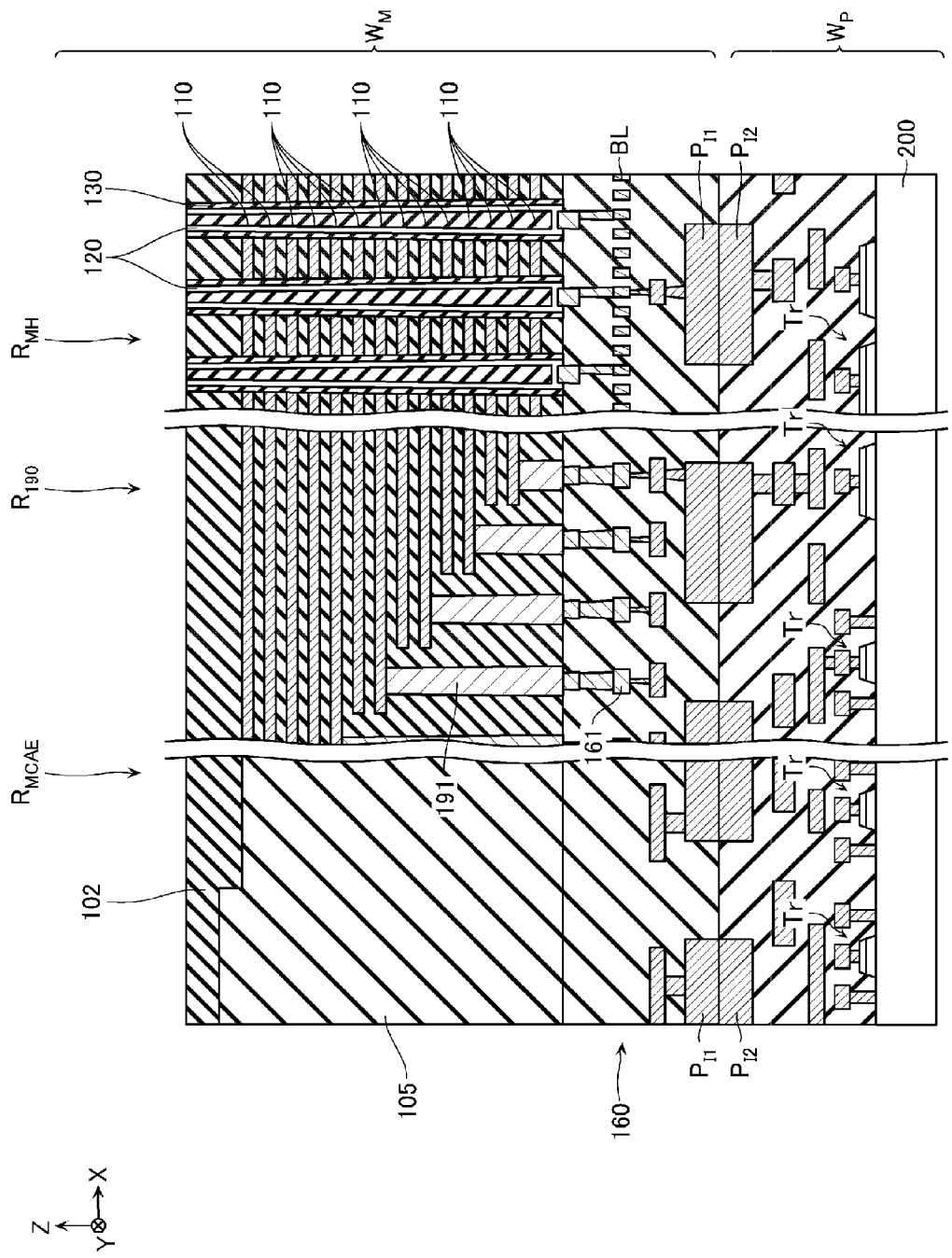
FIG. 25 is a schematic cross-sectional view illustrating the manufacturing method.

Next, for example, as illustrated in FIGS. 24 and 25, the semiconductor substrate 100 and the conductive layer 111 contained in the wafer $W_M$ are removed. Further, a part of the insulating layer 102, the gate insulating film 130, and the semiconductor layer 120 is removed to expose the upper ends of the semiconductor layer 120 and the insulating layer 125. This process is performed by, for example, a method such as wet etching or RIE.

Figure 26:
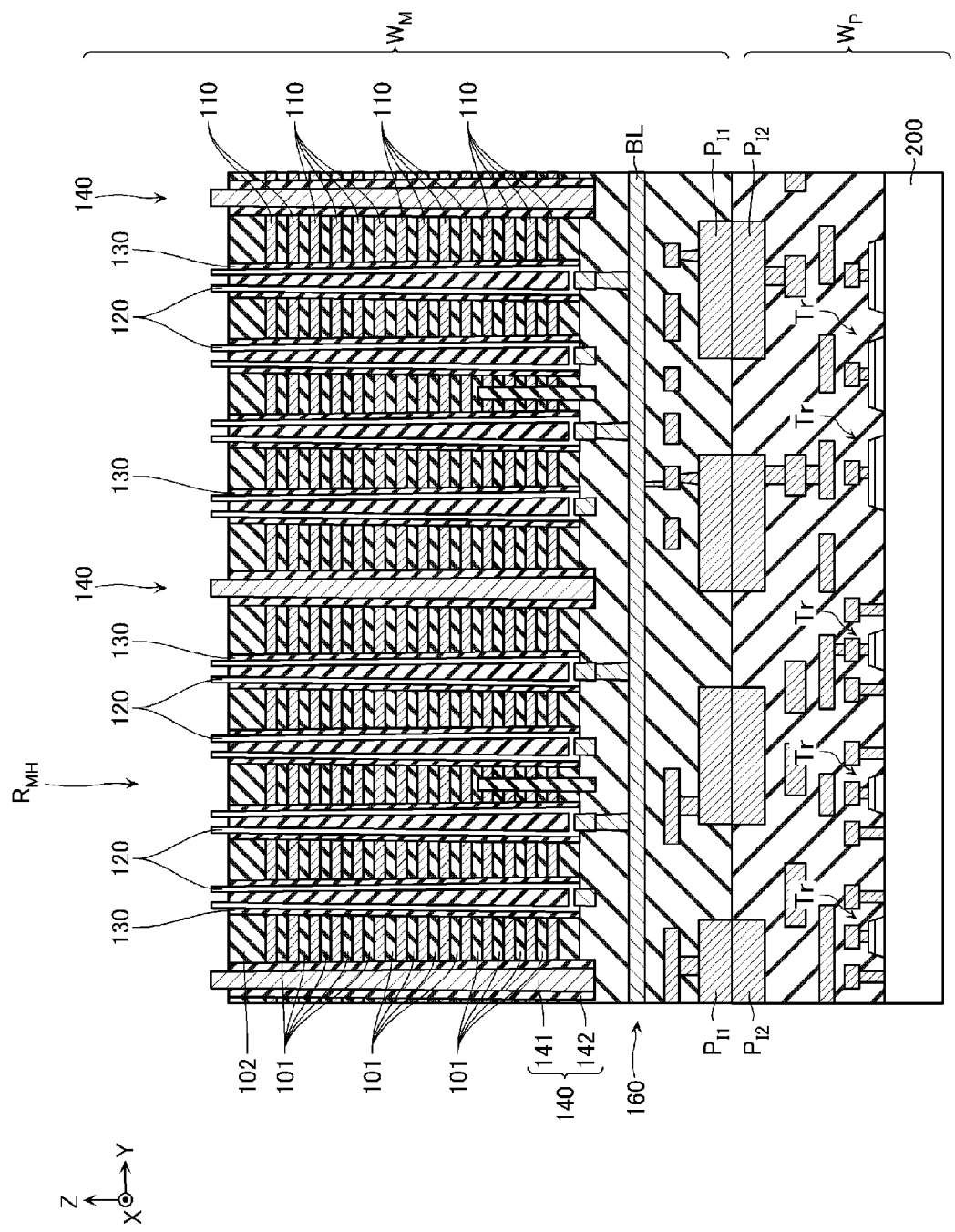
FIG. 26 is a schematic cross-sectional view illustrating the manufacturing method.
Figure 27:
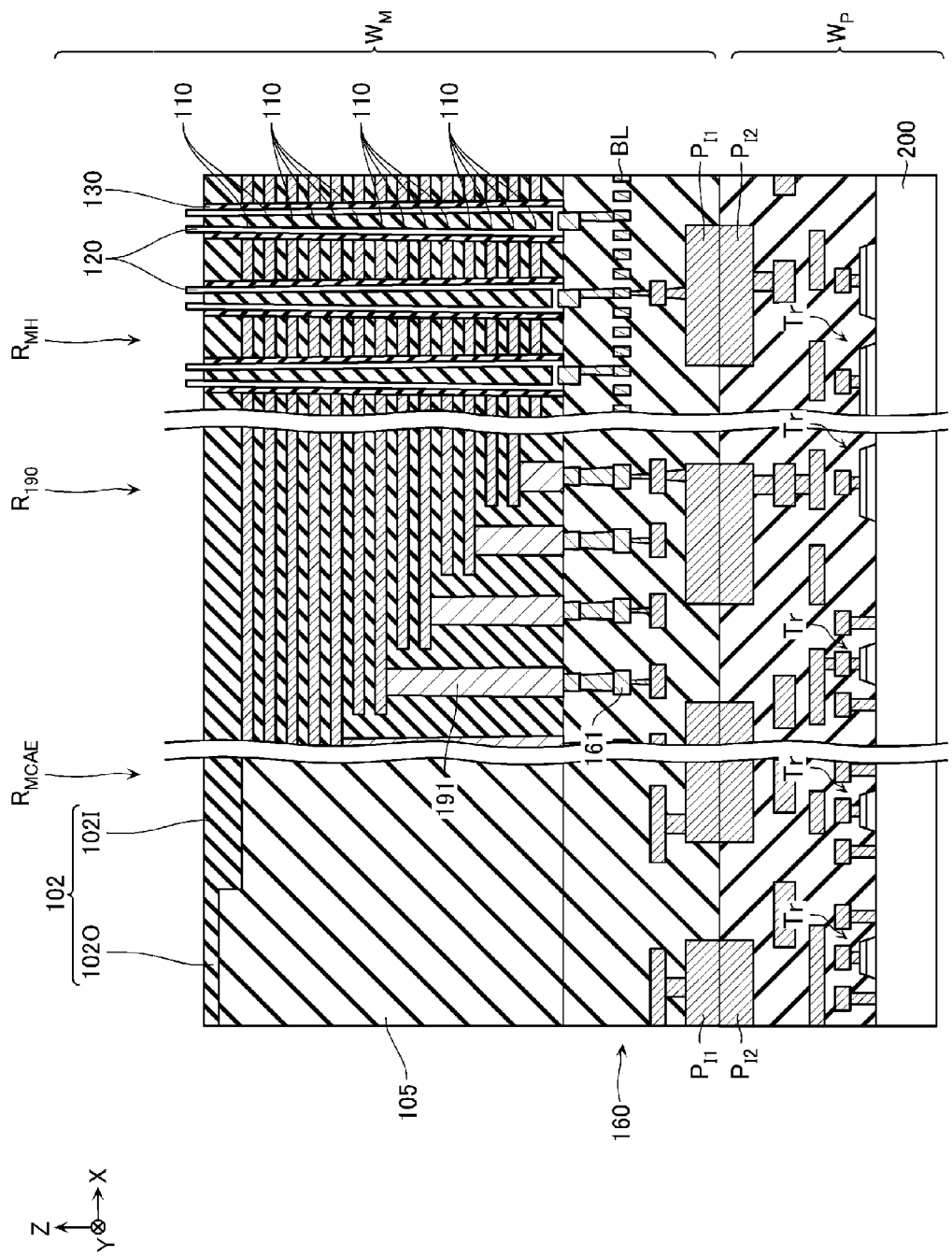
FIG. 27 is a schematic cross-sectional view illustrating the manufacturing method.

Next, for example, as illustrated in FIGS. 26 and 27, a part of the insulating layer 102 and the insulating layer 125 is removed. This process is performed by, for example, a method such as RIE under the condition of silicon oxide ($SiO_2$) being more easily removed than silicon (Si) and tungsten (W). By this process, the upper end of the semiconductor layer 120, the upper end of the conductive layer 141, and the upper end of a contact (not illustrated) are located above the upper surface of the insulating layer 102.

Next, an N-type impurity such as phosphorus (P) or a P-type impurity such as boron (B) is injected into the upper end of the semiconductor layer 120 of the structure illustrated in FIGS. 26 and 27. Further, a heat treatment may be performed, and thus, the injected impurity is bonded to silicon (Si) in the semiconductor layer 120.

Figure 28:
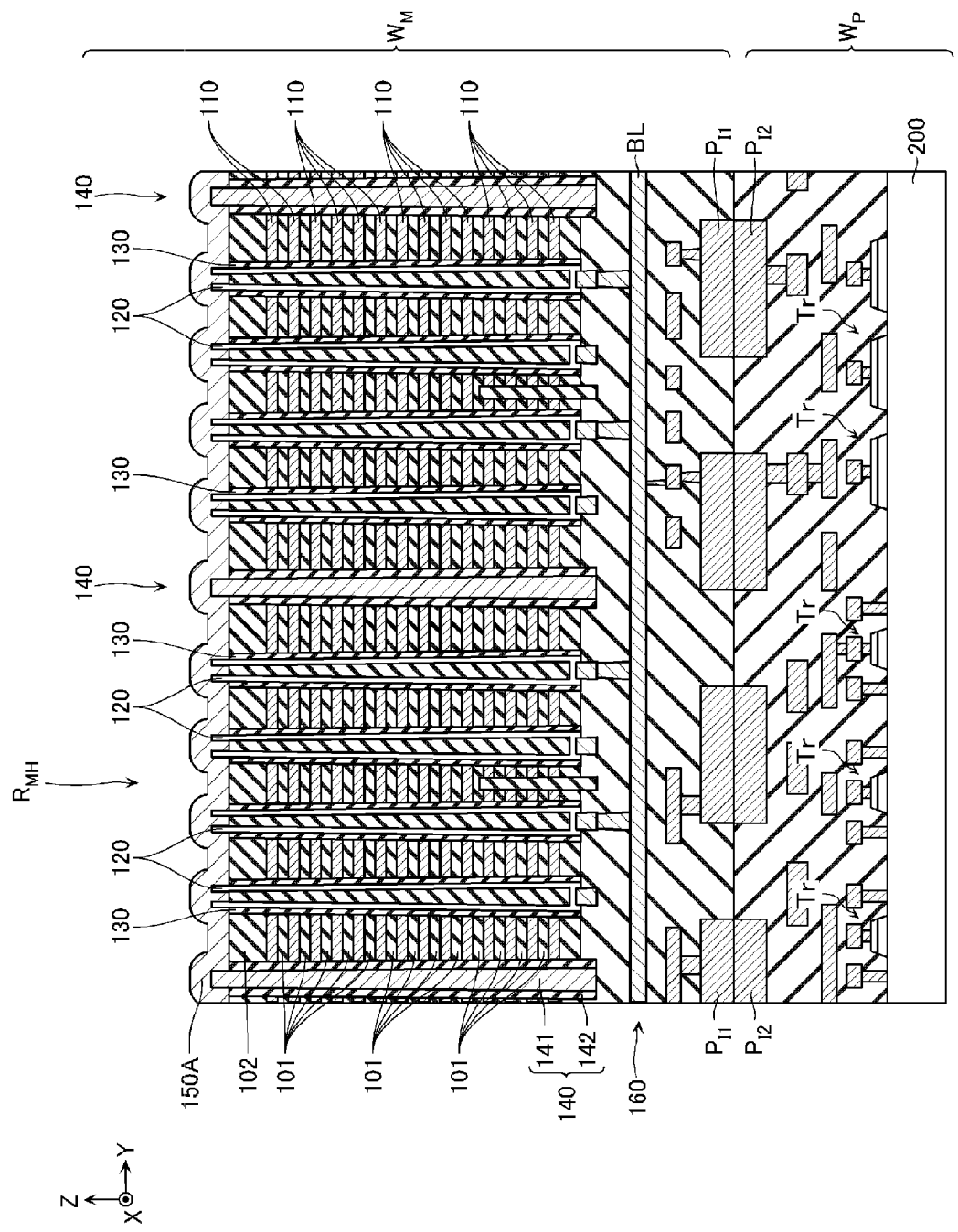
FIG. 28 is a schematic cross-sectional view illustrating the manufacturing method.

Next, for example, as illustrated in FIG. 28, a conductive layer 150A is formed on the upper surface of the structure as illustrated in FIGS. 26 and 27. This process is performed by, for example, a method such as CVD.

Next, the conductive layer 150A of the structure illustrated in FIG. 28 is divided into a plurality of portions. This process is performed by, for example, a method such as RIE. By this process, the conductive layer 150 (FIG. 4), the conductive layer 151 (FIG. 6), the conductive layer 152 (FIG. 9), and the conductive layer 153 (FIG. 9) are formed.

After that, the wiring layer 170 and the bonding pad electrodes $P_X$ are formed above this structure, and the structure in which the wafers $W_M$ and $W_P$ are laminated is diced to form the memory die MD.

[Effects]

It is possible to form a semiconductor storage device by forming a memory cell array on one wafer, forming a peripheral circuit on another wafer, and laminating these wafers. When the semiconductor storage device is formed by such a method, for example, apart of a semiconductor substrate in the wafer on the memory cell array side may be used as a part of source lines.

When the semiconductor storage device is formed by such a method, at the time of formation of bonding pad electrodes, it may be necessary to form through via holes in, for example, the semiconductor substrate in the wafer on the memory cell array side to expose wirings in the wafer. When such a method is adopted, however, it is necessary to form through via holes having a large aspect ratio in the semiconductor substrate, which may cause an increase in manufacturing costs.

Accordingly, in at least one embodiment, the semiconductor substrate 100 is removed in the process described with reference to FIGS. 24 and 25 to expose the upper end of the semiconductor layer 120. Further, in the process after this, the conductive layer 150 connected to the upper end of the semiconductor layer 120 is formed. According to such a method, it is not necessary to form through via holes having a large aspect ratio at the time of formation of the bonding pad electrodes $P_X$ as described above. Accordingly, it is possible to prevent an increase in manufacturing costs.

Further, in at least one embodiment, in the process described with reference to FIGS. 26 and 27, a part of the insulating layer 102 and the insulating layer 125 is removed to form the structure in which the upper end of the semiconductor layer 120 is located above the upper surface of the insulating layer 102 and the upper end of the insulating layer 125. Further, in the process described with reference to FIG. 28, the conductive layer 150 is formed on the outer peripheral surface and the inner peripheral surface of the upper end portion of the semiconductor layer 120. According to such a method, it is possible to increase the contact area between the semiconductor layer 120 and the conductive layer 150 as compared with, for example, a case where the process illustrated in FIGS. 26 and 27 is not performed. Thus, it is possible to significantly prevent the contact resistance between the semiconductor layer 120 and the conductive layer 150.

Further, in at least one embodiment, in the process described with reference to FIG. 11, the conductive layer 111 in contact with the upper surface of the semiconductor substrate 100 is formed. Further, in the process described with reference to FIG. 16, the through via holes 120A are formed so as to expose the conductive layer 111 at the bottom surface of the through via holes 120A. According to such a method, charges accumulated on the inner peripheral surface of the through via holes 120A at the time of formation of the through via holes 120A may be discharged via the conductive layer 111. Thus, it is possible to suitably manufacture the semiconductor storage device by preventing arc discharge that may occur due to such charges and the destruction of the structure that may occur due to the arc discharge.

Second Embodiment

Figure 29:
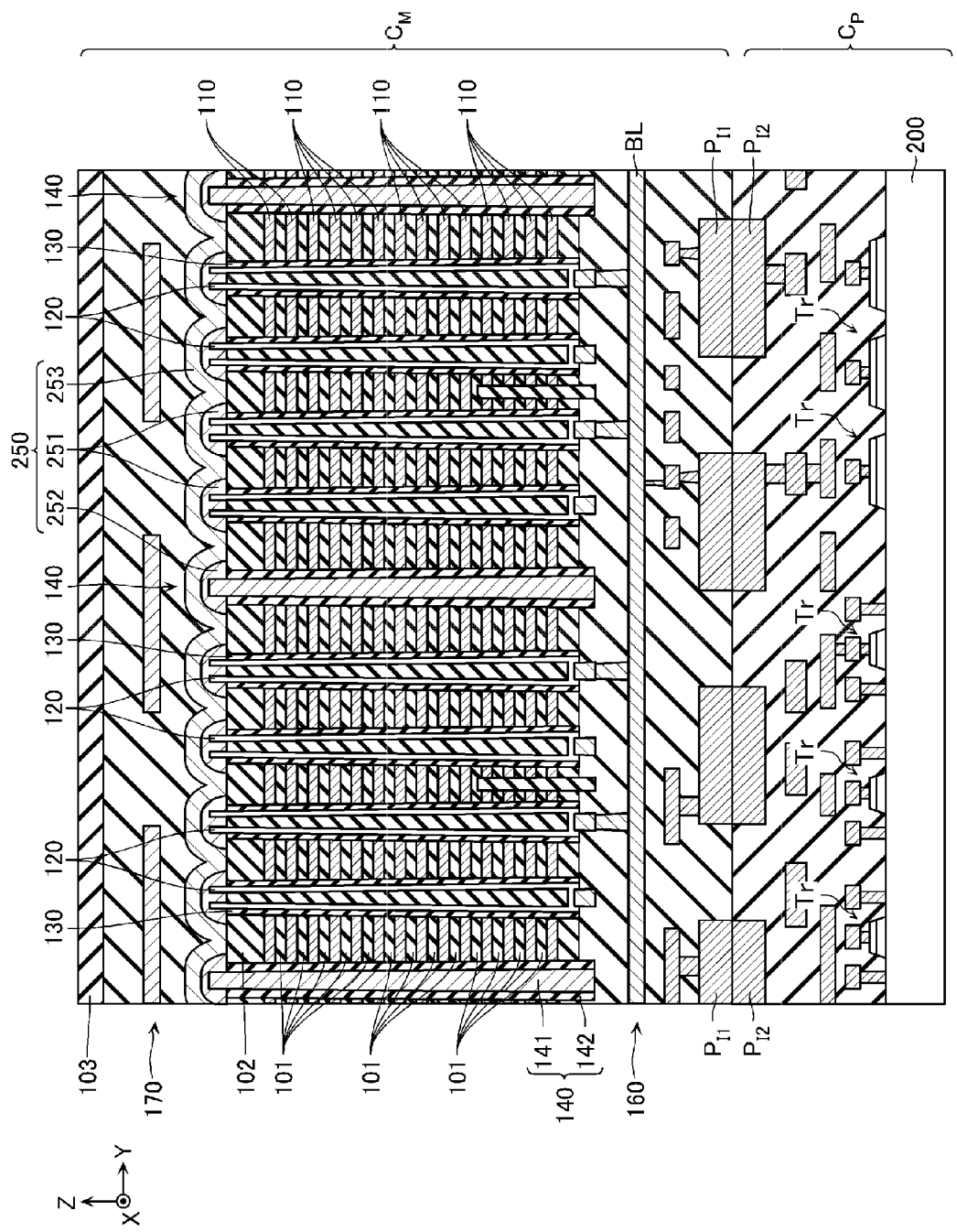
FIG. 29 is a schematic cross-sectional view illustrating a configuration of a semiconductor storage device according to a second embodiment.

Next, a configuration of a semiconductor storage device according to a second embodiment will be described with reference to FIG. 29. FIG. 29 is a schematic cross-sectional view illustrating the configuration of the semiconductor storage device according to the second embodiment.

The semiconductor storage device according to the second embodiment is substantially configured in the same manner as the semiconductor storage device according to the first embodiment. The semiconductor storage device according to the second embodiment, however, includes a conductive layer 250 instead of the conductive layer 150.

The conductive layer 250 includes a plurality of conductors 251 formed corresponding to the semiconductor layers 120, a plurality of conductors 252 formed corresponding to the conductive layers 141, and a conductor 253 covering the surfaces of the plurality of conductors 251 and 252. The conductive layer 250 functions as, for example, a part of source lines.

The conductors 251 may contain, for example, a stacked film of a barrier conductive film such as titanium nitride (TiN) and a metal film such as tungsten (W). Further, the conductors 251 may contain, for example, polycrystalline silicon containing an N-type impurity such as phosphorus (P) or a P-type impurity such as boron (B). Each conductor 251 is bonded to the upper end, the outer peripheral surface, and the inner peripheral surface of the upper end portion of the semiconductor layer 120. Further, the conductor 251 is in contact with the upper end of the insulating layer 125.

The conductors 252 may contain, for example, the same material as the conductors 251. Each conductor 252 is in contact with the side surface in the X direction and the upper end of the upper end portion of the conductive layer 141, and extends in the X direction along the upper end of the conductive layer 141.

The conductor 253 may contain, for example, a stacked film of a barrier conductive film such as titanium nitride (TiN) and a metal film such as tungsten (W). Further, the conductor 253 may contain, for example, polycrystalline silicon containing an N-type impurity such as phosphorus (P) or a P-type impurity such as boron (B). The conductor 253 may include, for example, the same material as or a different material from the conductor 251. The conductor 253 covers, for example, the upper surface of the insulating layer 102, the upper surfaces of the conductors 251, and the upper surfaces of the conductors 252.

Furthermore, although not illustrated, the semiconductor storage device according to at least one embodiment includes a plurality of conductive layers having the same structure as the conductive layer 250, instead of the conductive layer 151 (FIG. 6), the conductive layer 152 (FIG. 9), and the conductive layer 153 (FIG. 9). These plurality of conductive layers function as wirings corresponding to the conductive layer 151 (FIG. 6), the conductive layer 152 (FIG. 9), and the conductive layer 153 (FIG. 9), respectively.

Figure 30:
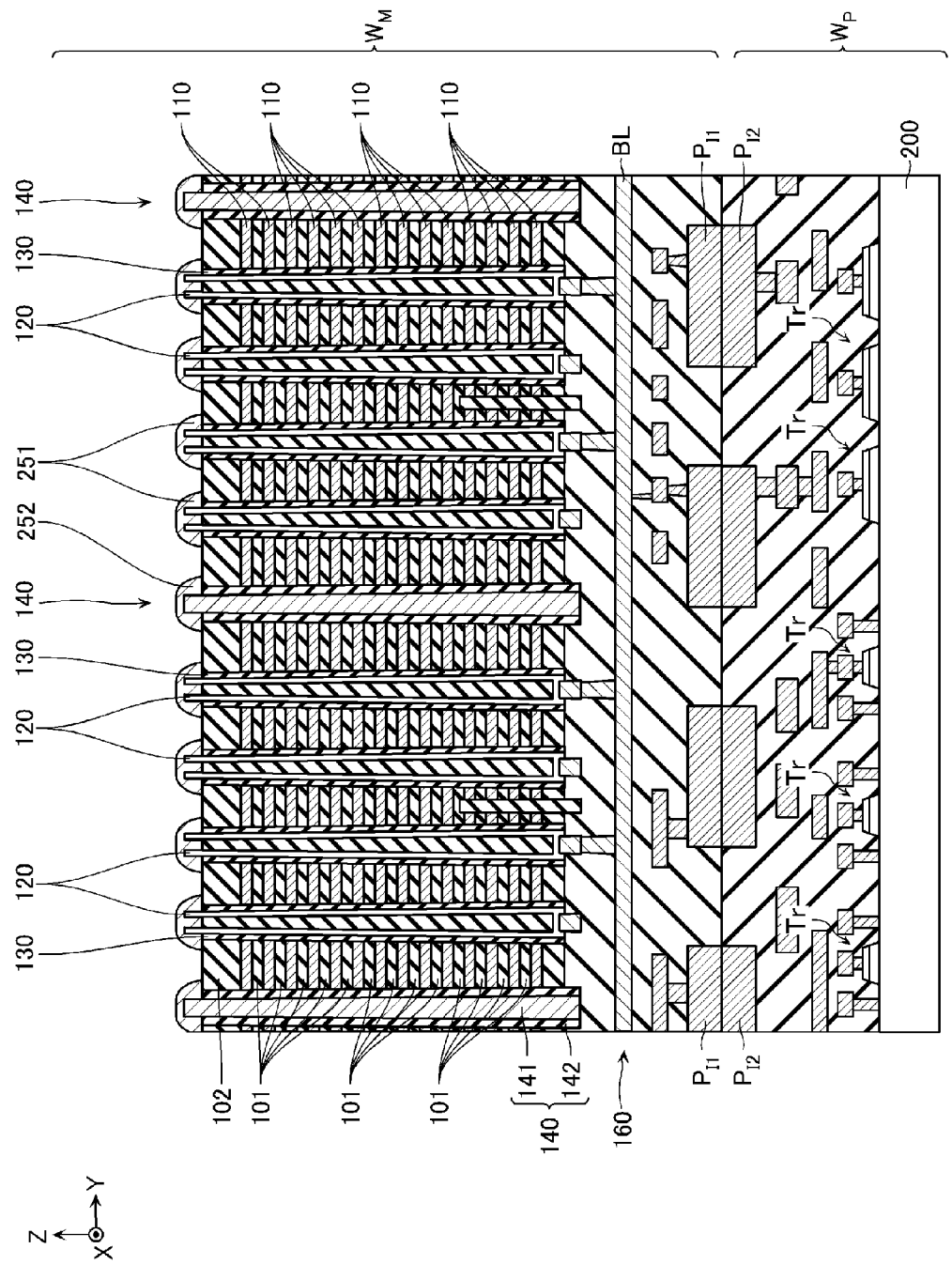
FIG. 30 is a schematic cross-sectional view illustrating a method of manufacturing the semiconductor storage device according to the second embodiment.
Figure 31:
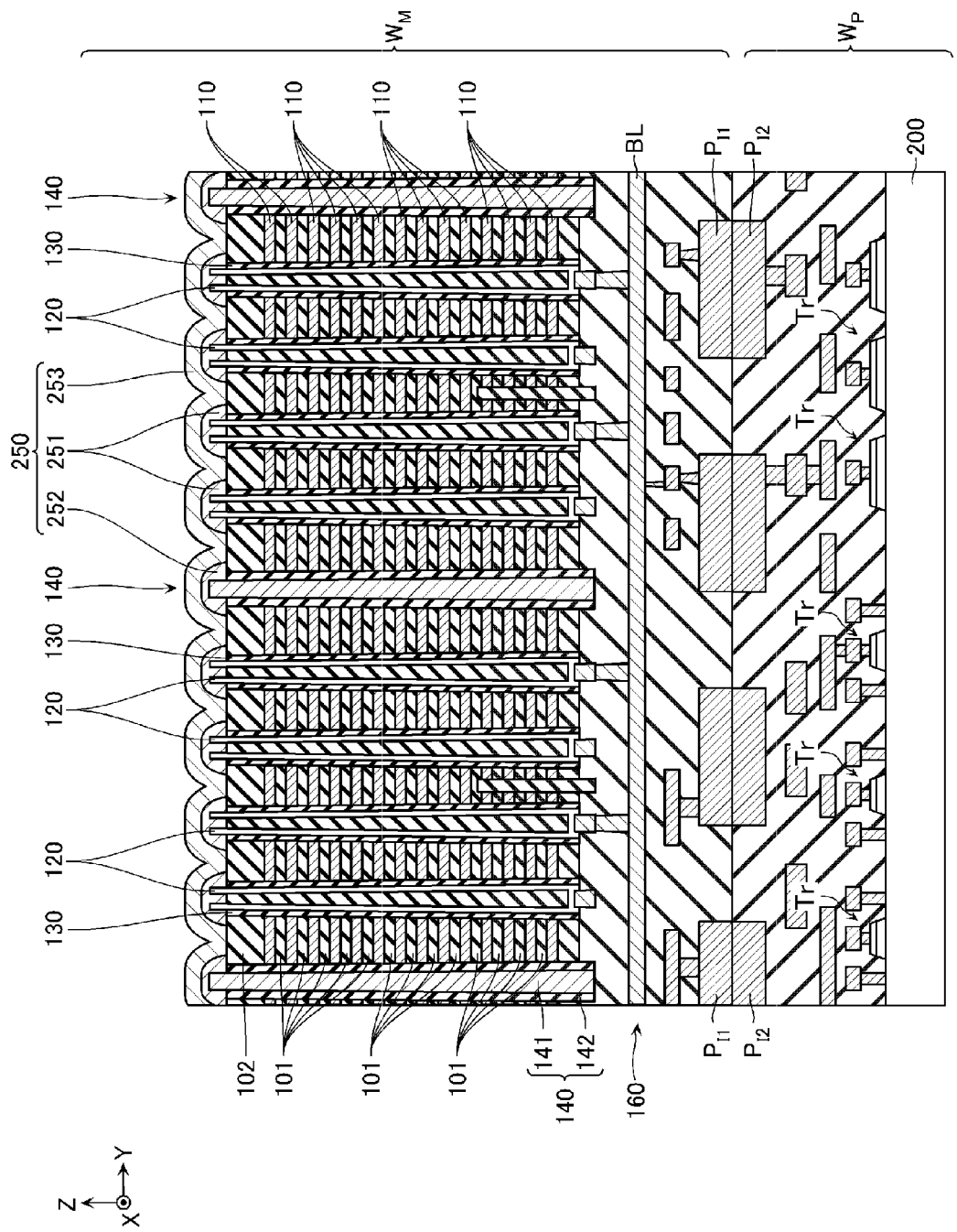
FIG. 31 is a schematic cross-sectional view illustrating the manufacturing method.

Next, a method of manufacturing the semiconductor storage device according to the second embodiment will be described with reference to FIGS. 30 and 31. FIGS. 30 and 31 are schematic cross-sectional views illustrating a method of manufacturing the semiconductor storage device according to the second embodiment.

The method of manufacturing the semiconductor storage device according to the present embodiment is substantially the same as the method of manufacturing the semiconductor storage device according to the first embodiment. In the present embodiment, however, for example, after the conductive layer 150A is formed in the process described with reference to FIG. 28, a portion of the conductive layer 150A formed on the upper surface of the insulating layer 102 is removed to form the plurality of conductors 251 and 252, for example, as illustrated in FIG. 30. This process is performed by, for example, a method such as RIE. Next, for example, as illustrated in FIG. 31, the conductor 253 is formed on the upper surface of the structure illustrated in FIG. 30. In this process, a conductive layer corresponding to the conductor 253 is formed by, for example, a method such as CVD, and the conductive layer is divided by a method such as RIE.

Third Embodiment

Figure 32:
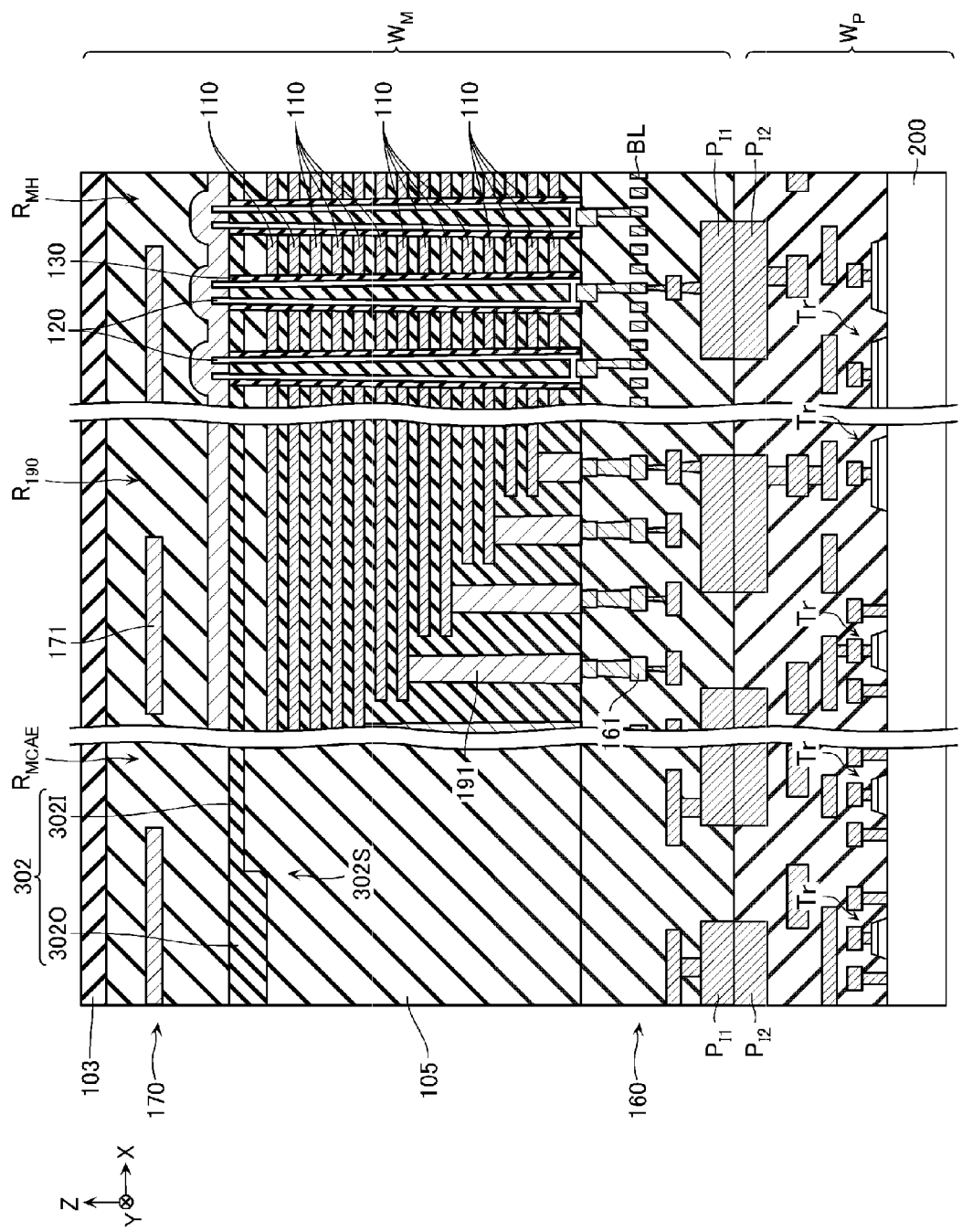
FIG. 32 is a schematic cross-sectional view illustrating a configuration of a semiconductor storage device according to a third embodiment.

Next, a configuration of a semiconductor storage device according to a third embodiment will be described with reference to FIG. 32. FIG. 32 is a schematic cross-sectional view illustrating the configuration of the semiconductor storage device according to the third embodiment.

The semiconductor storage device according to the third embodiment is substantially configured in the same manner as the semiconductor storage device according to the first embodiment. The semiconductor storage device according to the third embodiment, however, includes an insulating layer 302 instead of the insulating layer 102.

The insulating layer 302 is substantially configured in the same manner as the insulating layer 102 according to the first embodiment.

However, as described with reference to FIG. 7, the insulating layer 102 includes the portion 102I formed inside the memory cell array region $R_{MCA}$ and the portion 102O formed outside the memory cell array region $R_{MCA}$. Further, the thickness of the portion 102O in the Z direction is smaller than the thickness of the portion 102I in the Z direction. Further, the step 102S is formed at the connecting portion between the portion 102I and the portion 102O.

Meanwhile, as illustrated in FIG. 32, the insulating layer 302 includes a portion 302I formed inside the memory cell array region $R_{MCA}$ and a portion 302O formed outside the memory cell array region $R_{MCA}$. Further, the thickness of the portion 302O in the Z direction is larger than the thickness of the portion 302I in the Z direction. Further, a step 302S is formed at a connecting portion between the portion 302I and the portion 302O. The step 302S is formed, for example, along the outer edge of the memory cell array region $R_{MCA}$.

Furthermore, the semiconductor storage device according to at least one embodiment may include the conductive layer 250 instead of the conductive layer 150.

Figure 33:
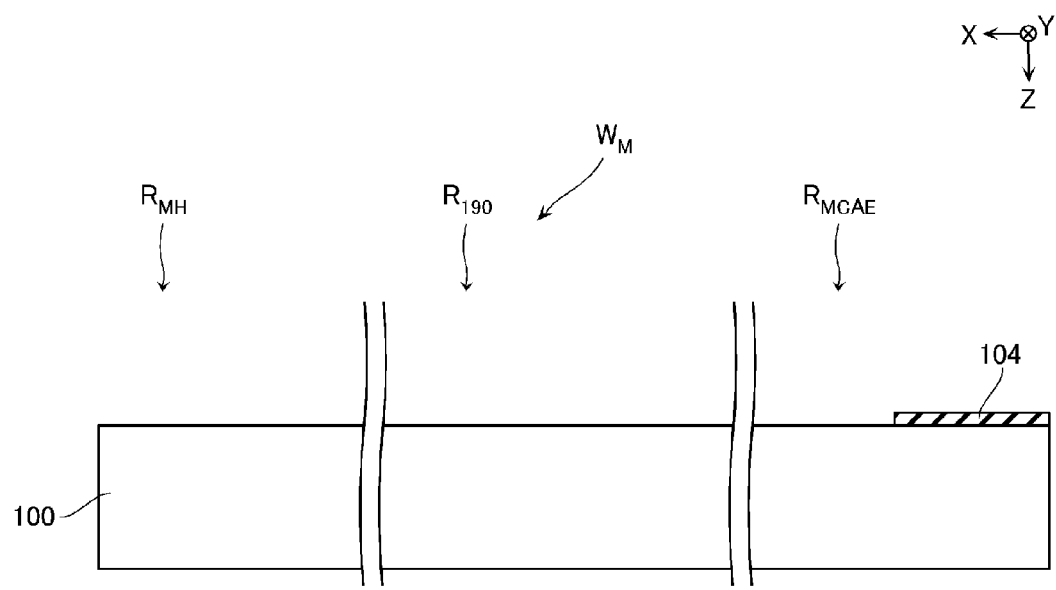
FIG. 33 is a schematic cross-sectional view illustrating a method of manufacturing the semiconductor storage device according to the third embodiment.

Next, a method of manufacturing the semiconductor storage device according to the third embodiment is described with reference to FIG. 33. FIG. 33 is a schematic cross-sectional view illustrating a method of manufacturing the semiconductor storage device according to the third embodiment.

The method of manufacturing the semiconductor storage device according to the present embodiment is substantially the same as the method of manufacturing the semiconductor storage device according to the first embodiment.

However, in the first embodiment, for example, in the process described with reference to FIG. 10, after forming the insulating layer 104 on the semiconductor substrate 100 of the wafer $W_M$, the insulating layer 104 is removed in a region outside the memory cell array region $R_{MCA}$ (FIG. 2) by a method such as RIE or wet etching.

Meanwhile, in at least one embodiment, for example, as illustrated in FIG. 33, after forming the insulating layer 104 on the semiconductor substrate 100 of the wafer $W_M$, the insulating layer 104 is removed in a region inside the memory cell array region $R_{MCA}$ (FIG. 2) other than a region outside the memory cell array region $R_{MCA}$ by a method such as RIE or wet etching.

Fourth Embodiment

Figure 34:
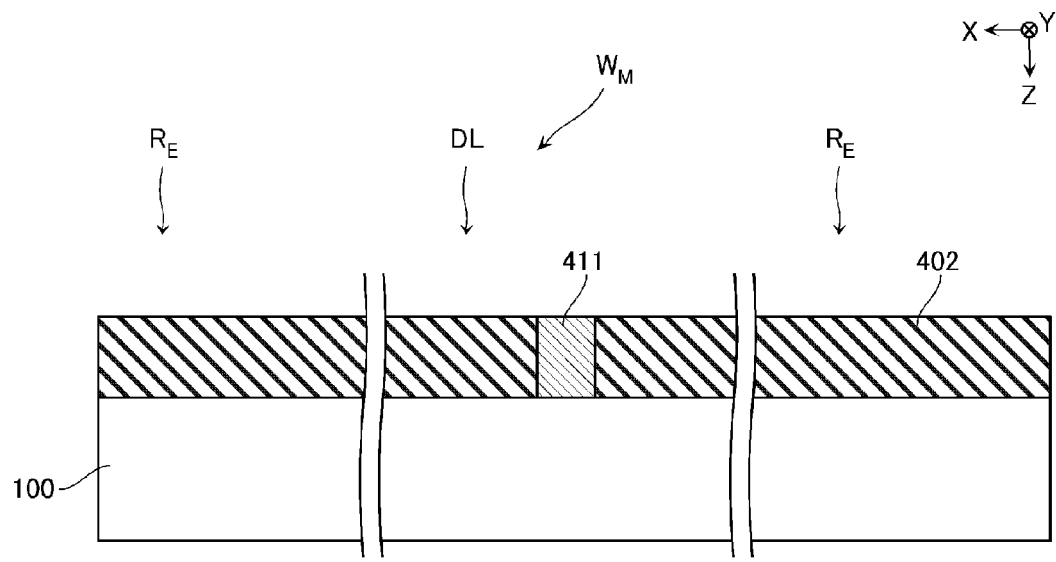
FIG. 34 is a schematic cross-sectional view illustrating a method of manufacturing a semiconductor storage device according to a fourth embodiment.

Next, a method of manufacturing a semiconductor storage device according to a fourth embodiment will be described with reference to FIG. 34. FIG. 34 is a schematic cross-sectional view illustrating the method of manufacturing the semiconductor storage device according to the fourth embodiment.

The method of manufacturing the semiconductor storage device according to the present embodiment is substantially the same as the method of manufacturing the semiconductor storage device according to the first embodiment. However, in at least one embodiment, the processes described with reference to FIGS. 10 and 11 are not performed. Further, in at least one embodiment, a conductive layer 411 in contact with the upper surface of the semiconductor substrate 100 is formed on a dicing line DL of the semiconductor substrate 100 in the wafer $W_M$. Further, an insulating layer 402 such as silicon oxide ($SiO_2$) is formed in the other region.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first chip including:
a semiconductor substrate having a surface; and
a transistor provided on the semiconductor substrate,
a second chip laminated on the first chip and including:
a plurality of first conductive layers arranged in a first direction;
an insulating film provided on the plurality of first conductive layers;
a pillar extending through the plurality of first conductive layers and the insulating film and including an insulating core, a first semiconductor layer covering an outer periphery of the insulating core, and a first gate insulating film covering an outer periphery of the first semiconductor layer;
a second conductive layer provided on the insulating film and connected to one end of the first semiconductor layer, wherein
the first semiconductor layer includes a first cylindrical portion facing the plurality of first conductive layers and the insulating film and a second cylindrical portion provided farther from the first chip than the first cylindrical portion in the first direction,
the second conductive layer is protruded inside the second cylindrical portion and reaches a surface of the insulating core,
the second conductive layer is in contact with an inner surface and an outer surface of the second cylindrical portion,
the second chip does not include a semiconductor substrate in the first direction farther from the second conductive layer than the first chip, and
wherein the insulating film comprises a plurality of insulating layers, an upper end of the insulating core is coplanar with an uppermost layer of the plurality of insulating layers.

2. The semiconductor storage device according to claim 1, further comprising:
a second semiconductor layer extending in the first direction and facing the plurality of first conductive layers, the second semiconductor layer including a third region facing the plurality of first conductive layers and a fourth region farther from the semiconductor substrate than the third region;
a second gate insulating film extending in the first direction and covering an outer peripheral surface of the second semiconductor layer; and
a second insulating layer extending in the first direction and having an outer peripheral surface covered by the second semiconductor layer,
wherein the second conductive layer is: (i) connected to an inner peripheral surface and an outer peripheral surface of the fourth region of the second semiconductor layer, and (ii) in contact with one end in the first direction of the second insulating layer.

3. The semiconductor storage device according to claim 2, further comprising:
a first contact connected to a substrate-side end of the first semiconductor layer;
a first bit line connected to the first contact;
a second contact connected to a substrate-side end of the second semiconductor layer; and
a second bit line connected to the second contact.

4. The semiconductor storage device according to claim 1, further comprising:
a third insulating layer farther from the semiconductor substrate than the plurality of first conductive layers and closer to the semiconductor substrate than the second conductive layer,
wherein the third insulating layer includes: a first portion that overlaps with the plurality of first conductive layers when viewed in the first direction, and a second portion that does not overlap with the plurality of first conductive layers when viewed in the first direction, and
wherein a thickness of the second portion in the first direction is smaller than a thickness of the first portion in the first direction, or the thickness of the second portion in the first direction being larger than the thickness of the first portion in the first direction.

5. The semiconductor storage device according to claim 1, further comprising:
a bonding pad electrode arranged farther from the semiconductor substrate than the second conductive layer; and
a first wiring provided between the second conductive layer and the bonding pad electrode and connected to the bonding pad electrode.

6. The semiconductor storage device according to claim 1, wherein the first conductive layers include a barrier conductive film.

7. The semiconductor storage device according to claim 1, wherein the first conductive layers include a stacked film including doped silicon.

8. The semiconductor storage device according to claim 1, wherein the first conductive layers are substantially plate-shaped.

9. The semiconductor storage device according to claim 1, wherein the first semiconductor layer is substantially cylindrical-shaped.

10. The semiconductor storage device according to claim 1, wherein the first gate insulating film includes a tunnel insulating film, a charge storage film, and a block insulating film.

* * * * *